US012684786B2

(12) United States Patent
Chung et al.

(10) Patent No.: US 12,684,786 B2
(45) Date of Patent: Jul. 14, 2026

(54) SEMICONDUCTOR PACKAGE AND METHOD OF FABRICATING THE SAME

(71) Applicant: Samsung Electronics Co., Ltd., Suwon-si (KR)

(72) Inventors: Hyunsoo Chung, Suwon-si (KR); Young Lyong Kim, Suwon-si (KR); Inhyo Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 485 days.

(21) Appl. No.: 18/122,285

(22) Filed: Mar. 16, 2023

(65) Prior Publication Data

US 2024/0040805 A1     Feb. 1, 2024

(30) Foreign Application Priority Data

Jul. 26, 2022     (KR) ........................ 10-2022-0092593

(51) Int. Cl.
| | |
|---|---|
| *H10B 80/00* | (2026.01) |
| *H01L 23/31* | (2006.01) |
| *H01L 25/00* | (2006.01) |
| *H10W 74/10* | (2026.01) |
| *H10W 90/00* | (2026.01) |
| H10D 30/01 | (2025.01) |
| H10K 59/88 | (2023.01) |
| H10W 74/15 | (2026.01) |

(52) U.S. Cl.
CPC .......... *H10B 80/00* (2023.02); *H10W 74/117* (2026.01); *H10W 90/00* (2026.01); *H10W 90/724* (2026.01); *H10D 30/0243* (2025.01);

*H10K 59/88* (2023.02); *H10W 74/15* (2026.01); *H10W 90/734* (2026.01)

(58) Field of Classification Search
CPC ......... H10B 80/00; H01L 25/50; H01L 25/18; H01L 25/0652; H01L 25/0655; H01L 25/0657; H01L 2224/97; H01L 2225/06589; H01L 23/367; H01L 23/3736; H01L 23/3185; H01L 21/563; H10D 30/0243; H10K 59/88
See application file for complete search history.

(56) References Cited

U.S. PATENT DOCUMENTS

| | | | |
|---|---|---|---|
| 7,804,170 | B2 | 9/2010 | Kakegawa |
| 8,922,230 | B2 | 12/2014 | Wang et al. |
| 11,164,807 | B2 | 11/2021 | Wuu et al. |
| 11,222,882 | B2 | 1/2022 | Kim |

(Continued)

FOREIGN PATENT DOCUMENTS

| | | |
|---|---|---|
| KR | 20180054440 A | 5/2018 |
| KR | 20210066387 A | 6/2021 |
| KR | 1020210157095 A | 12/2021 |

*Primary Examiner* — Lawrence C Tynes, Jr.
(74) *Attorney, Agent, or Firm* — Muir Patent Law, PLLC

(57) ABSTRACT

A semiconductor package may include a substrate, a chip structure mounted on the substrate, and a first dummy structure attached to the chip structure. The chip structure may include a first semiconductor chip, a second dummy structure disposed at a side of the first semiconductor chip, and a mold layer enclosing the first semiconductor chip and the second dummy structure. A bottom surface of the first semiconductor chip, a bottom surface of the second dummy structure, and a bottom surface of the mold layer may be coplanar with each other.

17 Claims, 15 Drawing Sheets

(56)                    References Cited

U.S. PATENT DOCUMENTS

| | | | |
|---|---|---|---|
| 2008/0128916 A1 | 6/2008 | Soejima et al. | |
| 2019/0115272 A1* | 4/2019 | Yu ............................ | H01L 25/03 |
| 2020/0303341 A1* | 9/2020 | Kim ........................ | H01L 25/50 |
| 2021/0118817 A1 | 4/2021 | Wu et al. | |
| 2021/0343660 A1 | 11/2021 | Lee | |
| 2022/0093564 A1* | 3/2022 | Chen ................... | H01L 25/0657 |
| 2022/0102239 A1* | 3/2022 | Kamoda ................. | H01L 24/45 |
| 2022/0130761 A1 | 4/2022 | Kim et al. | |

* cited by examiner

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0092593, filed on Jul. 26, 2022, in the Korean Intellectual Property Office, the entire contents of which are hereby incorporated by reference.

BACKGROUND OF THE INVENTION

The present disclosure relates to a semiconductor package and a method of fabricating the same, and in particular, to a stack-type semiconductor package and a method of fabricating the same.

With the recent advance in the electronics industry, demand for high-performance, high-speed, and compact electronic components is increasing. To meet this demand, packaging technologies of mounting a plurality of semiconductor chips in a single package are being developed.

Recently, demand for portable electronic devices has been rapidly increasing in the market, and thus, it is important to reduce sizes and weights of electronic components constituting the portable electronic devices. For this, it is useful to develop packaging technologies of reducing a size and a weight of each component and of integrating a plurality of individual components in a single package. Especially, for a semiconductor package in which a plurality of components are provided, it is important to improve warpage, heat-dissipation, and electric characteristics of the semiconductor package, in addition to the reducing of the size of the package.

SUMMARY

An embodiment of the inventive concept provides a semiconductor package with improve heat-dissipation efficiency and a method of fabricating the same.

An embodiment of the inventive concept provides a semiconductor package with improved structural stability and a method of fabricating the same.

An embodiment of the inventive concept provides a method of reducing a failure in a process of fabricating a semiconductor package and a semiconductor package fabricated thereby.

According to an embodiment of the inventive concept, a semiconductor package may include a substrate, a chip structure mounted on the substrate, and a first dummy block disposed on a top surface of the chip structure. The chip structure may include a first semiconductor chip, a second dummy block disposed at a side of the first semiconductor chip, and a mold layer enclosing the first semiconductor chip and the second dummy structure. A bottom surface of the first semiconductor chip, a bottom surface of the second dummy structure, and a bottom surface of the mold layer may be coplanar with each other.

According to an embodiment of the inventive concept, a semiconductor package may include a package substrate, an interposer substrate disposed on the package substrate, a chip stack mounted on the interposer substrate, the chip stack including first semiconductor chips, which are vertically stacked, a second semiconductor chip mounted on the interposer substrate and horizontally spaced apart from the chip stack, the second semiconductor chip having a first side surface facing the chip stack, a second side surface adjacent to the first side surface, and a third side surface opposite the first side surface, a first dummy structure provided on one of the second side surface of the second semiconductor chip and the third side surface of the second semiconductor chip, and an under-fill layer filling a space between the second semiconductor chip and the interposer substrate and between the first dummy structure and the interposer substrate. The first dummy structure may be spaced apart from the interposer substrate by the under-fill layer, and the first dummy structure may include bulk silicon.

According to an embodiment of the inventive concept, a method of fabricating a semiconductor package may include forming a chip structure, mounting a chip stack, in which first semiconductor chips are stacked, and the chip structure on a substrate, attaching a first dummy structure to an upper surface of the chip structure, and forming a first mold layer on the substrate to enclose the chip stack, the chip structure, and the first dummy structure. The forming of the chip structure may include attaching a second semiconductor chip and a second dummy structure to a carrier substrate, forming a second mold layer on the carrier substrate to cover the second semiconductor chip and the second dummy structure, performing a sawing process on the second dummy structure to expose a side surface of the second dummy structure, and removing the carrier substrate to expose an active surface of the second semiconductor chip. The second semiconductor chip may have a first side surface facing the chip stack and a second side surface adjacent to the first side surface, and the exposed side surface of the second dummy structure corresponds to the second side surface.

According to an embodiment of the inventive concept, a semiconductor package may include a substrate, a chip stack mounted on the substrate, the chip stack including first semiconductor chips, which are vertically stacked, a chip structure mounted on the substrate and horizontally spaced apart from the chip stack, a first dummy structure disposed on the chip structure, and a first mold layer disposed on the substrate to enclose the chip stack, the chip structure, and the first dummy structure. The chip structure may include a second semiconductor chip having a first side surface facing the chip stack, a second side surface adjacent to the first side surface, and a third side surface opposite the first side surface, a second dummy structure disposed on the second side surface of the second semiconductor chip or the third side surface of the second semiconductor chip, and a second mold layer disposed between the second semiconductor chip and the second dummy structure to connect the second semiconductor chip to the second dummy structure. The first dummy structure may be attached to an upper surface of the second semiconductor chip and an upper surface of the second dummy structure. The chip structure may be mounted on the substrate through a connection terminal below the second semiconductor chip, and the second dummy structure may be spaced apart from the substrate.

BRIEF DESCRIPTION OF THE DRAWINGS

FIGS. 8 to 10 are sectional views illustrating a semiconductor package according to an example embodiment of the inventive concept.

FIGS. 11A to 15A are plan views illustrating a method of fabricating a semiconductor package according to an example embodiment of the inventive concept.

FIGS. 11B to 15B are sectional views illustrating a method of fabricating a semiconductor package according to an example embodiment of the inventive concept.

DETAILED DESCRIPTION

Example embodiments of the inventive concepts will now be described more fully with reference to the accompanying drawings, in which example embodiments are shown.

Figure 1:
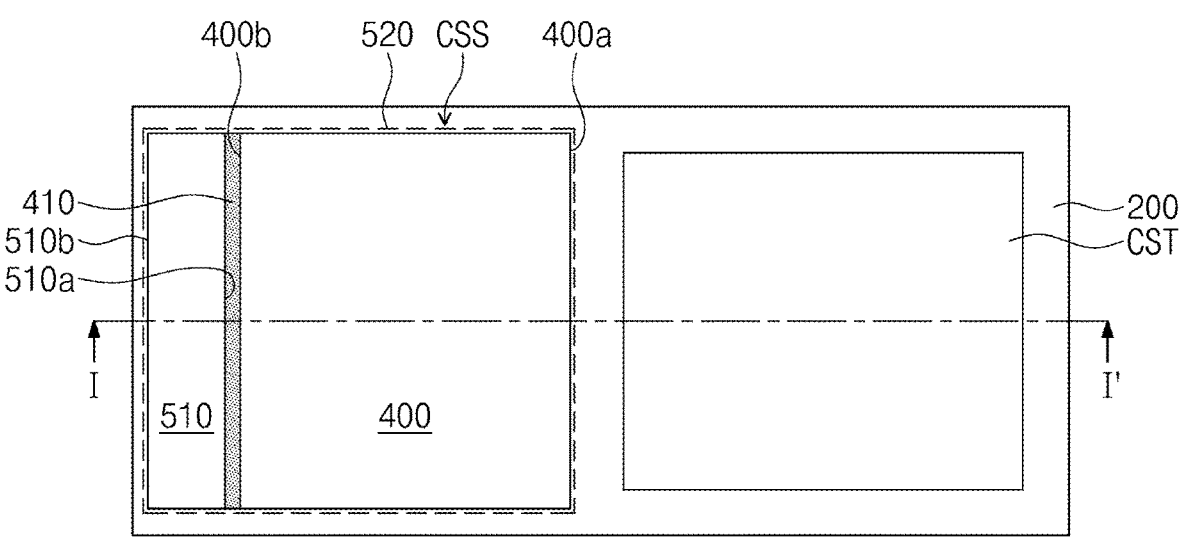
FIG. 1 is a plan view illustrating a semiconductor package according to an example embodiment of the inventive concept.
Figure 2:
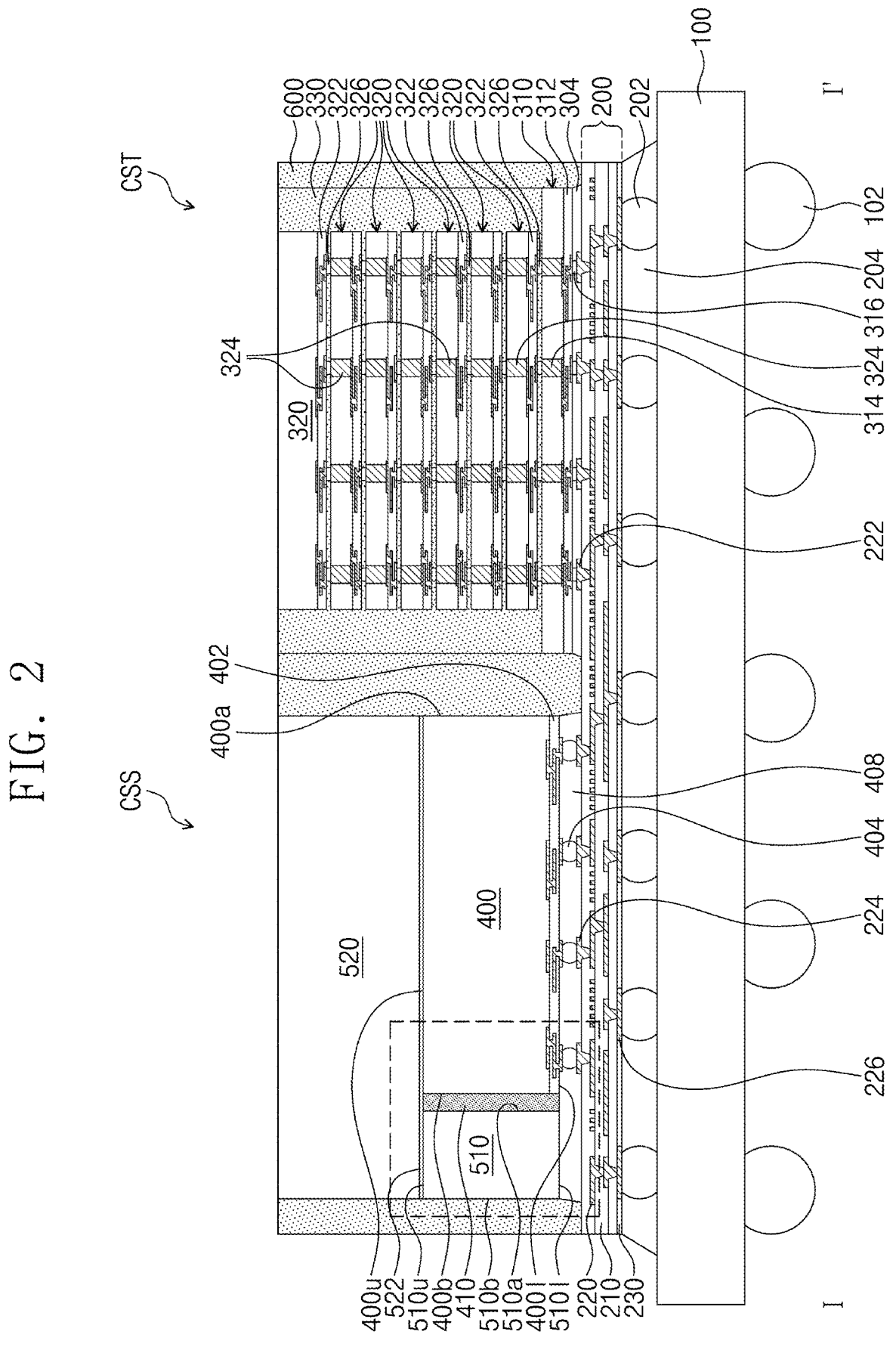
FIG. 2 is a sectional view illustrating a semiconductor package according to an example embodiment of the inventive concept.
Figure 3:
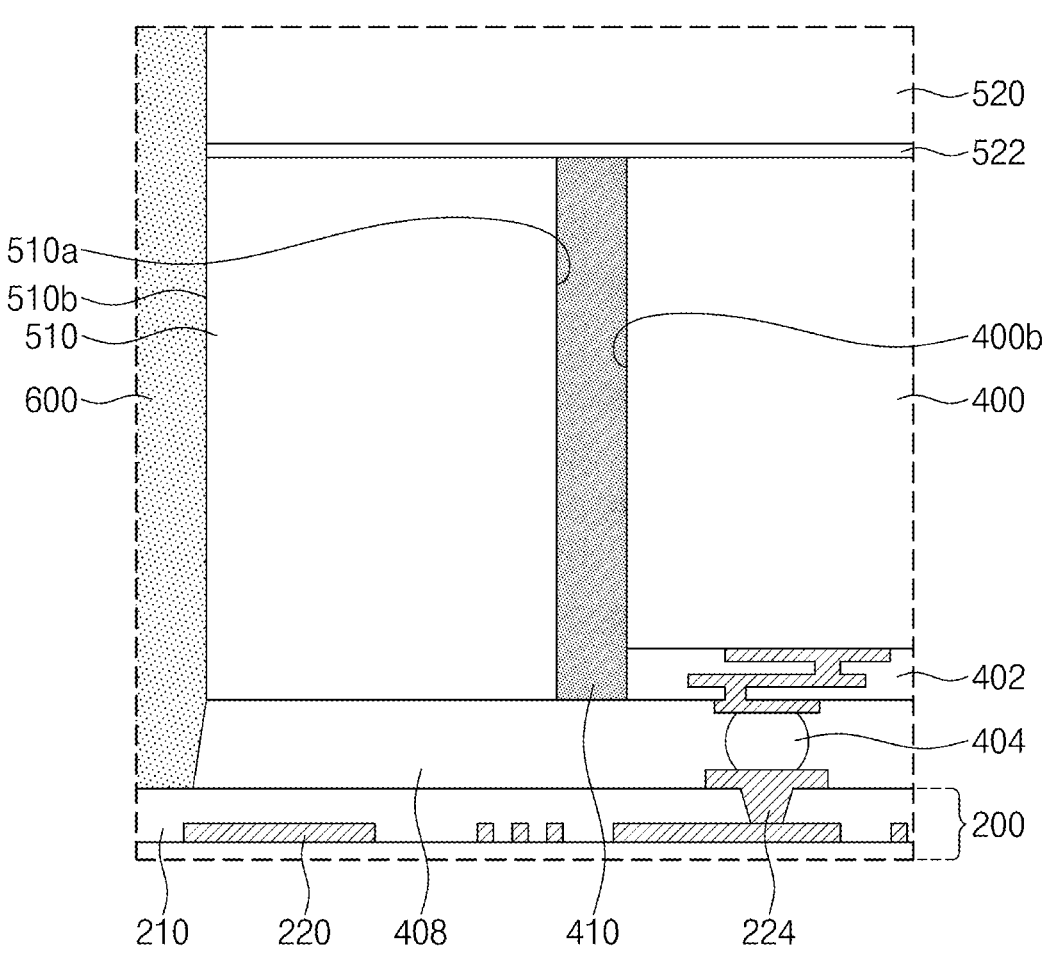
FIG. 3 is an enlarged sectional view illustrating a portion 'A' of FIG. 2.
Figure 4:
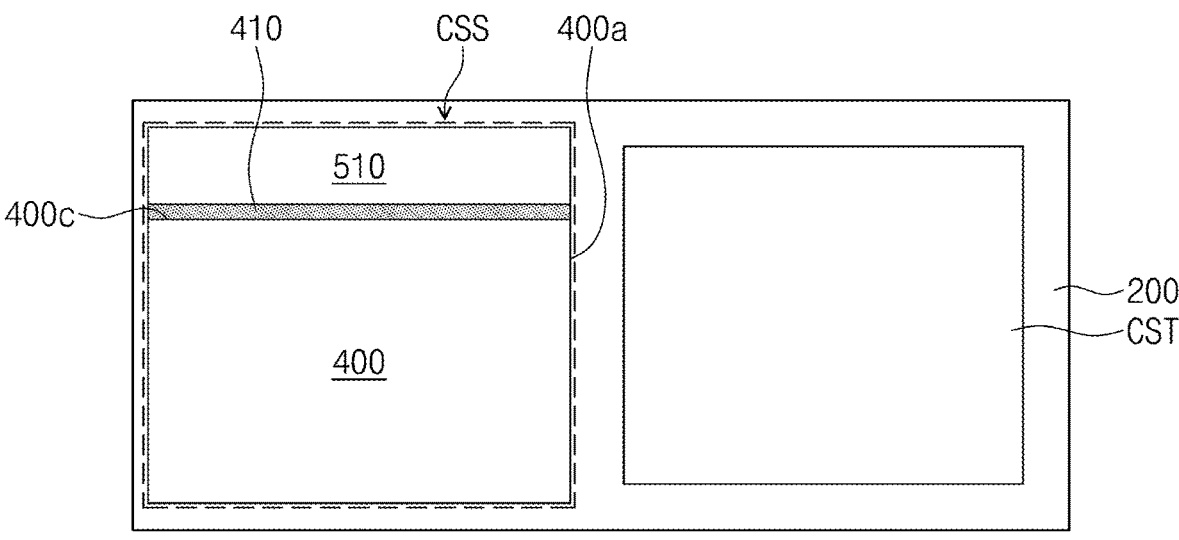
FIG. 4 is a plan view illustrating a semiconductor package according to an example embodiment of the inventive concept.

FIG. 1 is a plan view illustrating a semiconductor package according to an example embodiment of the inventive concept. FIG. 2 is a sectional view, which is taken along a line I-I' of FIG. 1 to illustrate a semiconductor package according to an example embodiment of the inventive concept. FIG. 3 is an enlarged sectional view illustrating a portion 'A' of FIG. 2. FIG. 4 is a plan view illustrating a semiconductor package according to an example embodiment of the inventive concept.

Referring to FIGS. 1 and 2, a package substrate 100 may be provided. The package substrate 100 may be or include a printed circuit board (PCB) having signal patterns provided on an upper surface thereof. In certain embodiments, the package substrate 100 may be provided to have a structure, in which at least one insulating layer and at least one interconnection layer are alternately stacked. The package substrate 100 may include pads, which are disposed on an upper surface thereof.

Outer terminals 102, also described as external connection terminals, may be provided under the package substrate 100. In detail, the outer terminals 102 may be disposed on terminal pads (e.g., external connection pads), which are provided on a lower surface of the package substrate 100. The outer terminals 102 may be or include solder balls or solder bumps, and the semiconductor package may be classified into a ball grid array (BGA) package, a fine ball-grid array (FBGA) package, or a land grid array (LGA) package, depending on the kind and arrangement of the outer terminals 102. The outer terminals 102 and terminal pads may communicate (e.g., pass signals) between the semiconductor package and an external device connected to the semiconductor package.

An interposer substrate 200 may be provided on the package substrate 100. The interposer substrate 200 may include at least two substrate wiring layers. Each of the substrate wiring layers may include a substrate insulating pattern 210 and a substrate wire pattern 220 in the substrate insulating pattern 210. The substrate wire pattern 220 of one of the substrate wiring layers may be electrically connected to the substrate wire pattern 220 of another substrate wiring layer adjacent thereto.

The substrate insulating pattern 210 may be formed of or include at least one of insulating polymers or photoimageable dielectric (PID) materials. For example, the PID materials may be formed of or include photo-imagable polyimides, polybenzoxazole (PBO), phenol-based polymers, and benzocyclobutene-based polymers.

The substrate wire pattern 220 may be provided in the substrate insulating pattern 210. The substrate wire pattern 220 may have a damascene structure. For example, the substrate wire pattern 220 may include a head portion and a tail portion which are connected to each other to form a single object. The head portion may be a wire or pad portion, which is used to extend a wire in the interposer substrate 200 in a horizontal direction. The tail portion may be a via portion, which is used to connect wires in the interposer substrate 200 to each other in a vertical direction. The substrate wire pattern 220 may have a 'T'-shaped section. An upper portion of the substrate wire pattern 220 (i.e., the head portion of the substrate wire pattern 220) may be disposed on an upper surface of the substrate insulating pattern 210. For example, the head portion of the substrate wire pattern 220 may be extended to a level higher than the substrate insulating pattern 210 formed directly below it. A lower portion of the substrate wire pattern 220 (i.e., the tail portion of the substrate wire pattern 220) may be provided to penetrate the substrate insulating pattern 210. The tail portion of the substrate wire pattern 220 of one of the substrate wiring layers may be coupled to the head portion of the substrate wire pattern 220 of another substrate wiring layer thereunder. Alternatively, the head portion of the substrate wire pattern 220 may be buried in an upper portion of the substrate insulating pattern 210, and an upper surface of the head portion of the substrate wire pattern 220 may be exposed to the outside of the substrate insulating pattern 210 near the upper surface of the substrate insulating pattern 210. A lower surface of the tail portion of the substrate wire pattern 220 may be exposed to the outside of the substrate insulating pattern 210 near a lower surface of the substrate insulating pattern 210. The substrate wire pattern 220 may be formed of or include at least one of conductive materials. For example, the substrate wire pattern 220 may be formed of or include copper (Cu).

The head portion of the substrate wire pattern 220 of the uppermost one of the substrate wiring layers may correspond to substrate pads 222 and 224 of the interposer substrate 200. The substrate pads 222 and 224 may include first substrate pads 222, which are used to mount a chip stack CST, and second substrate pads 224, which are used to mount a chip structure CSS.

Third substrate pads 226 may be provided below the lowermost one of the substrate wiring layers. The third substrate pads 226 may be coupled to the substrate wire pattern 220. The third substrate pads 226 may be formed of or include at least one of conductive materials. For example, the third substrate pads 226 may be formed of or include copper (Cu).

A substrate passivation layer 230 may be provided below the lowermost one of the substrate wiring layers. The substrate passivation layer 230 may be provided to cover the entire lower surface of the interposer substrate 200. Here, the third substrate pads 226 may be exposed to the outside of the substrate passivation layer 230 near a lower surface of the substrate passivation layer 230.

The interposer substrate 200 may be mounted on the upper surface of the package substrate 100. Substrate terminals 202 (e.g., interposer substrate terminals) may be disposed on the lower surface of the interposer substrate 200. The substrate terminals 202 may be provided between the pads of the package substrate 100 and the third substrate pads 226 of the interposer substrate 200. The substrate terminals 202 may electrically connect the interposer substrate 200 to the package substrate 100. For example, the interposer substrate 200 may be mounted on the package substrate 100 in a flip-chip bonding manner. In an embodiment, the substrate terminals 202 may include or may be solder balls or solder bumps.

A first under-fill layer 204 may be provided between the package substrate 100 and the interposer substrate 200. The first under-fill layer 204 may fill a space between the package substrate 100 and the interposer substrate 200 and may enclose the substrate terminals 202, and may be formed of an electrically insulating material.

The chip stack CST may be disposed on the interposer substrate 200. The chip stack CST may include a base substrate, first semiconductor chips 320 stacked on the base substrate, and a first mold layer 330 enclosing the first semiconductor chips 320. Hereinafter, the structure of the chip stack CST will be described in more detail.

The base substrate may be a base semiconductor chip 310. For example, the base substrate may be a wafer-level semiconductor substrate that is formed of a semiconductor material (e.g., silicon (Si)). Hereinafter, the base semiconductor chip 310 may be an element that is identical to the base substrate, and the base semiconductor chip and the base substrate may be identified using the same reference number 310 (e.g., the base semiconductor chip 310 may be referred to more generally as a base substrate).

The base semiconductor chip 310 may include a base circuit layer 312 and base penetration electrodes 314. The base circuit layer 312 may be provided on a lower surface of the base semiconductor chip 310. The base circuit layer 312 may include an integrated circuit. For example, the base circuit layer 312 may be a memory circuit. For example, the base semiconductor chip 310 may be one of memory chips, such as DRAM, SRAM, MRAM and FLASH memory chips. The base penetration electrodes 314 may be provided to penetrate the base semiconductor chip 310 in a direction perpendicular to an upper surface of the interposer substrate 200. The base penetration electrodes 314 may be formed of a conductive material, such as a metal, for example. The base penetration electrodes 314 and the base circuit layer 312 may be electrically connected to each other. The lower surface of the base semiconductor chip 310 may be an active surface. Although FIG. 1 illustrates an example, in which the base substrate includes the base semiconductor chip 310, the inventive concept is not limited to this example. In an embodiment, the base substrate may not include the base semiconductor chip 310.

The base semiconductor chip 310 may further include a protection layer and first connection terminals 316. The protection layer may be disposed on the lower surface of the base semiconductor chip 310 to cover the base circuit layer 312. The protection layer may be formed of or include silicon nitride (SiN). The first connection terminals 316 may be provided on the lower surface of the base semiconductor chip 310. The first connection terminals 316 may be electrically connected to an input/output circuit (e.g., the memory circuit), a power circuit, or a ground circuit of the base circuit layer 312. The first connection terminals 316 may be exposed to the outside of the protection layer.

The first semiconductor chip 320 (e.g., a plurality of first semiconductor chips 320 that form the stack) may be mounted on the base semiconductor chip 310. The first semiconductor chip 320 and the base semiconductor chip 310 may be provided to form a chip-on-wafer (COW) structure. A width of the first semiconductor chip 320 (e.g., horizontal width in a first horizontal direction) may be smaller than a width of the base semiconductor chip 310 (e.g., horizontal width in the same first horizontal direction).

The first semiconductor chip 320 may include a first circuit layer 322 and first penetration electrodes 324. The first circuit layer 322 may include or may be a memory circuit. For example, the first semiconductor chip 320 may be one of memory chips, such as DRAM, SRAM, MRAM and FLASH memory chips. The first circuit layer 322 may include the same circuit as the base circuit layer 312, but the inventive concept is not limited to this example. The first penetration electrodes 324 may be provided to penetrate the first semiconductor chip 320 in a direction perpendicular to the upper surface of the interposer substrate 200. The first penetration electrodes 324 and the first circuit layer 322 may be electrically connected to each other. A lower surface of the first semiconductor chip 320 may be an active surface. First chip bumps 326 may be provided on the lower surface of the first semiconductor chip 320. Between the base semiconductor chip 310 and the first semiconductor chip 320, the first chip bumps 326 may connect the base semiconductor chip 310 to the first semiconductor chip 320 electrically.

In an embodiment, a plurality of the first semiconductor chips 320 may be provided. For example, the first semiconductor chips 320 may be stacked on the base semiconductor chip 310. The number of the first semiconductor chips 320 stacked may be, for example, 8 to 32. The first chip bumps 326 may be respectively provided between the first semiconductor chips 320. Here, the topmost one of the first semiconductor chips 320 may not have the first penetration electrodes 324. In addition, the topmost one of the first semiconductor chips 320 may be thicker than the remaining ones of the first semiconductor chips 320 disposed therebelow.

Although not shown, an adhesive layer may be disposed between adjacent ones of the first semiconductor chips 320. The adhesive layer may be or include a non-conductive film (NCF). The adhesive layer may be interposed between adjacent first semiconductor chips 320 and between the first bumps 326 to prevent a short circuit from being formed between the first bumps 326.

The first mold layer 330 may be disposed on an upper surface of the base semiconductor chip 310. The first mold layer 330 may cover the base semiconductor chip 310 and may enclose the first semiconductor chips 320. An upper surface of the first mold layer 330 may be coplanar with an upper surface of the uppermost one of the first semiconductor chips 320, and the uppermost one of the first semiconductor chips 320 may be exposed to the outside of the first mold layer 330. The first mold layer 330 may be formed of or include an insulating polymer material. For example, the first mold layer 330 may be formed of or include an epoxy molding compound (EMC).

The chip stack CST may be mounted on the interposer substrate 200. For example, the chip stack CST may be coupled to the first substrate pads 222 of the interposer substrate 200 through the first connection terminals 316 of the base semiconductor chip 310. The first connection terminals 316 may be provided between the first substrate pads 222 of the interposer substrate 200 and the base circuit layer 312.

A second under-fill layer 304 may be provided between the interposer substrate 200 and the chip stack CST. The second under-fill layer 304 may fill a space between the interposer substrate 200 and the base semiconductor chip 310 and may enclose the first connection terminals 316.

The chip structure CSS may be disposed on the interposer substrate 200. The chip structure CSS may be spaced apart from the chip stack CST. The chip structure CSS may refer to the structure connected to the second semiconductor chip 400 and formed at the same vertical level of the second semiconductor chip 400. The chip stack CST may refer to the stack of chips including chip 310 and chips 320, from a bottom of the base chip 310 (or bottom of a bottom-most first chip 320 if a base chip is not used) to a top of an uppermost first chip 320. A distance (e.g., horizontal distance) between the chip structure CSS and the chip stack CST may be in a range from 50 μm to 100 μm. A thickness (e.g., in a vertical direction) of the chip structure CSS may be smaller than a thickness of the chip stack CST. The thickness (e.g., in the vertical direction) of the chip stack CST may be in a range from 50 μm to 200 μm. The chip structure CSS may include a second semiconductor chip 400, a first dummy structure 510, and a second mold layer 410. Hereinafter, the structure of the chip structure CSS will be described in more detail.

Referring to FIGS. 1 to 3, the second semiconductor chip 400 may be formed of or include a semiconductor material (e.g., silicon (Si)). The second semiconductor chip 400 may include a second circuit layer 402. The second circuit layer 402 may include a logic circuit. For example, the second semiconductor chip 400 may be a logic chip. As an example, the second semiconductor chip 400 may be a system-on-chip (SOC). A lower surface of the second semiconductor chip 400 may be an active surface, and an upper surface of the second semiconductor chip 400 may be an inactive surface. A thickness (e.g., in a vertical direction) of the second semiconductor chip 400 may be in a range from 50 μm to 200 μm. The second semiconductor chip 400 may have a first side surface 400a, which faces the chip stack CST, and a second side surface 400b, which does not face the chip stack CST. The second side surface 400b of the second semiconductor chip 400 may be a surface, on which the first dummy structure 510 to be described below will be disposed. In the embodiment of FIG. 1, the second side surface 400b may be a side surface that is opposite to the first side surface 400a. The first side surface 400a of the second semiconductor chip 400 may correspond to a side surface of the chip structure CSS facing the chip stack CST. Therefore, the second semiconductor chip 400 may be an element of the chip structure CSS, which is closest to the chip stack CST. Thus, a distance between the first side surface 400a of the second semiconductor chip 400 and the chip stack CST may correspond to a distance between the chip structure CSS and the chip stack CST. The distance between the first side surface 400a of the second semiconductor chip 400 and the chip stack CST may be in a range from 50 μm to 100 μm.

The first dummy structure 510 may be provided on the second side surface 400b of the second semiconductor chip 400. It will be understood that when an element is referred to as being "on" or "coupled to" or "connected to" another element, it can be directly connected or coupled to or on the other element or intervening elements may be present. In contrast, when an element is referred to as being "directly on" or "directly coupled to" or "directly connected to"

another element, or as "contacting" or "in contact with" another element (or using any form of the word "contact"), there are no intervening elements present at the point of contact. The first dummy structure 510 may be spaced apart from the second side surface 400b of the second semiconductor chip 400. Here, a distance between the second side surface 400b of the second semiconductor chip 400 and the first dummy structure 510 may be smaller than the distance between the first side surface 400a of the second semiconductor chip 400 and the chip stack CST. In an embodiment, the first dummy structure 510 may contact the second side surface 400b of the second semiconductor chip 400. An upper surface 510u (e.g., a top surface) of the first dummy structure 510 may be located at the same level as (e.g., may be coplanar with) an upper surface 400u (e.g., a top surface) of the second semiconductor chip 400. A lower surface 510l (e.g., a bottom surface) of the first dummy structure 510 may be located at the same level as (e.g., may be coplanar with) a lower surface 400l (e.g., a bottom surface) of the second semiconductor chip 400. When measured in a horizontal direction parallel to the second side surface 400b of the second semiconductor chip 400, a width of the first dummy structure 510 may be equal to a width of the second semiconductor chip 400. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise. In an embodiment, unlike the structure shown in FIG. 1, the width in a horizontal direction parallel to the second side surface 400b of the first dummy structure 510 may be smaller than the width in the same direction of the second semiconductor chip 400. The first dummy structure 510 may have a first side surface 510a, which faces the second semiconductor chip 400, and a second side surface 510b, which does not face the second semiconductor chip 400. The second side surface 510b of the first dummy structure 510 may be a side surface that is opposite to the first side surface 510a. In an embodiment, no integrated circuit is provided in the first dummy structure 510. The first dummy structure 510 may be formed of or include at least one of materials having high thermal conductivity. For example, the first dummy structure 510 may be formed of or include bulk silicon (Si). The first dummy structure 510 may be a block of material (e.g., silicon or other heat conductive material having a parallelepiped, e.g., rectangular cuboid shape), and may be described as a dummy block, or dummy substrate. The first dummy structure 510 may be a single, integrated piece of material. The bulk silicon (Si) may be a piece of a silicon ingot that has been separated (e.g., a piece of a separated silicon wafer), and does not include any integrated circuits or processed layers.

The second mold layer 410 may be interposed between the second semiconductor chip 400 and the first dummy structure 510. The second mold layer 410 may fill a space between the second semiconductor chip 400 and the first dummy structure 510. The second mold layer 410 may contact the second semiconductor chip 400 and the first dummy structure 510. The second mold layer 410 may connect the second semiconductor chip 400 to the first dummy structure 510. The second semiconductor chip 400 and the first dummy structure 510 may be combined by the second mold layer 410. An upper surface of the second mold layer 410 may be located at the same level (e.g., vertical level) as the upper surface 510u of the first dummy structure 510 and the upper surface 400*u* of the second semiconductor chip 400. In other words, the upper surface of the second mold layer 410, the upper surface 510*u* of the first dummy structure 510, and the upper surface 400*u* of the second semiconductor chip 400 may be coplanar with each other. A lower surface of the second mold layer 410 may be located at the same level (e.g., vertical level) as the lower surface 510*l* of the first dummy structure 510 and the lower surface 400*l* of the second semiconductor chip 400. In other words, the lower surface of the second mold layer 410, the lower surface 510*l* of the first dummy structure 510, and the lower surface 400*l* of the second semiconductor chip 400 may be coplanar with each other. The second mold layer 410 may be formed of or include an insulating material (e.g., epoxy molding compound (EMC)) or an adhesive material. In an embodiment, the first dummy structure 510 may contact the second side surface 400*b* of the second semiconductor chip 400, and in this case, the second mold layer 410 may not be provided between the second semiconductor chip 400 and the first dummy structure 510. In addition, in some embodiments, the second mold layer 410 may not contact the second side surface 510*b* of the first dummy structure 510. For example, the second side surface 510*b* of the first dummy structure 510 may be exposed to the outside of the package.

According to an example embodiment of the inventive concept, since the first dummy structure 510 having a high thermal conductivity is provided on a surface of the second semiconductor chip 400, heat, which is generated in the second semiconductor chip 400, may be easily exhausted to the outside through the exposed second side surface 510*b* of the first dummy structure 510. Furthermore, since the first dummy structure 510 is disposed on the second side surface 400*b* of the second semiconductor chip 400, which does not face the chip stack CST, not on the first side surface 400*a* of the second semiconductor chip 400 facing the chip stack CST, the heat, which is generated in the second semiconductor chip 400, may be directed and exhausted to the outside through the first dummy structure 510. Thus, it may be possible to improve the heat-dissipation efficiency of the semiconductor package.

FIG. 1 illustrates an example, in which the second side surface 400*b* of the second semiconductor chip 400 near the first dummy structure 510 is opposite to the first side surface 400*a* of the second semiconductor chip 400, but the inventive concept is not limited to this example. As shown in FIG. 4, a second side surface 400*c* of the second semiconductor chip 400 that faces a first dummy structure 510 may be a side surface that is connected to the first side surface 400*a*. The first dummy structure 510 may be disposed on the second side surface 400*c* of the second semiconductor chip 400. In this case, not only the first side surface 400*a* of the second semiconductor chip 400 but also one of side surfaces of the first dummy structure 510 may be disposed to face the chip stack CST, and the second mold layer 410 between the first dummy structure 510 and the second semiconductor chip 400 may also have a side surface facing the chip stack CST. Here, distances from the second semiconductor chip 400, the first dummy structure 510, and the second mold layer 410 to the chip stack CST may be in a range from 50 μm to 100 μm.

In an embodiment, a plurality of the first dummy structures 510 may be provided. Here, the first dummy structures 510 may be provided on at least two of sides surfaces of the second semiconductor chip 400, except for the first side surface 400*a*. However, the following description will be given based on the embodiment of FIG. 1.

Referring to FIGS. 1 to 3, second connection terminals 404 may be provided on the lower surface 400*l* of the second semiconductor chip 400 of the chip structure CSS. The second connection terminals 404 may be electrically connected to an input/output circuit (e.g., the logic circuit), a power circuit, or a ground circuit of the second circuit layer 402.

The chip structure CSS may be mounted on the interposer substrate 200. For example, the chip structure CSS may be coupled to the second substrate pads 224 of the interposer substrate 200 through the second connection terminals 404. The second connection terminals 404 may be provided between the second substrate pads 224 of the interposer substrate 200 and the second circuit layer 402 of the second semiconductor chip 400. Since the chip structure CSS is mounted on the interposer substrate 200 using the second connection terminals 404, a lower surface of the chip structure CSS may be spaced apart from the interposer substrate 200. For example, the lower surface 400*l* of the second semiconductor chip 400 and the lower surface of the first dummy structure 510 may be spaced apart from the upper surface of the interposer substrate 200. The first dummy structure 510 may not be electrically connected or physically directly connected to the interposer substrate 200.

A third under-fill layer 408 may be provided between the interposer substrate 200 and the chip structure CSS. The third under-fill layer 408 may fill a space between the interposer substrate 200 and the second semiconductor chip 400 and may enclose the second connection terminals 404. The third under-fill layer 408 may extend into a region between the interposer substrate 200 and the first dummy structure 510. The first dummy structure 510 may be spaced apart from the interposer substrate 200 by the third under-fill layer 408. A width of the third under-fill layer 408 may be larger or smaller than a width of the chip structure CSS. Accordingly, when viewed in a plan view, the first dummy structure 510 and the second semiconductor chip 400 may overlap the third under-fill layer 408.

A second dummy structure 520 may be provided on the chip structure CSS. The second dummy structure 520 may be attached to an upper surface of the chip structure CSS. For example, the second dummy structure 520 may be attached to the entire upper surface 400*u* of the second semiconductor chip 400. Thus, the entirety of the second semiconductor chip 400 may overlap at least a portion of the second dummy structure 520. The second dummy structure 520 may be attached to the upper surface 510*u* of the first dummy structure 510 and the upper surface of the second mold layer 410. An upper surface of the second dummy structure 520 may be located at the same level as the upper surface of the chip stack CST. In an embodiment, no integrated circuit is provided in the second dummy structure 520. The second dummy structure 520 may be formed of or include at least one of materials having high thermal conductivity. For example, the second dummy structure 520 may be formed of or include bulk silicon (Si). The second dummy structure 520 may be a block of material (e.g., silicon or other heat conductive material having a parallelepiped, e.g., rectangular cuboid, shape), and may be described as a dummy block, or dummy substrate, or a dummy plate. The second dummy structure 520 may be a single, integrated piece of material.

The second dummy structure 520 may be attached to the upper surface of the chip structure CSS using an adhesive layer 522. The adhesive layer 522 may be formed of or include a thermal interface material (TIM) (e.g., thermal grease).

According to an example embodiment of the inventive concept, since the second dummy structure 520 having a high thermal conductivity is provided on the upper surface 400*u* of the second semiconductor chip 400, heat, which is generated in the second semiconductor chip 400, may be easily exhausted to an external space on the second dummy structure 520. In particular, since the first and second dummy structures 510 and 520 having a high thermal conductivity are provided on the side surface and the upper surface 400*u* of the second semiconductor chip 400, the heat, which is generated in the second semiconductor chip 400, may be easily exhausted to the outside. Thus, it may be possible to improve the heat-dissipation efficiency of the semiconductor package. The second dummy structure 520 may be formed of a metal or semiconductor material that conducts heat.

A third mold layer 600 may be provided on the interposer substrate 200. The third mold layer 600 may cover the upper surface of the interposer substrate 200. The third mold layer 600 may be provided to enclose the chip stack CST, the chip structure CSS, and the second dummy structure 520. The third mold layer 600 may be formed of or include an insulating material. For example, the third mold layer 600 may be formed of or include epoxy molding compound (EMC). The third mold layer 600 may be formed of or include a different material from the first and second dummy structures 510 and 520. The third mold layer 600 combined with the second mold layer 410 may be described together as a mold layer.

Figure 5:
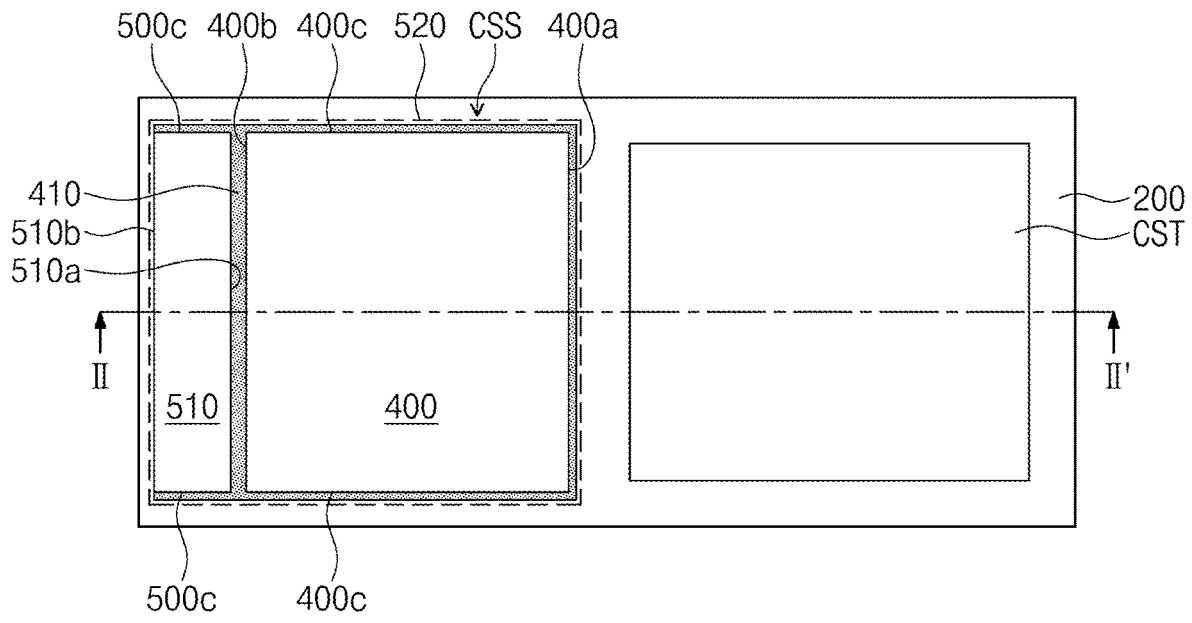
FIG. 5 is a plan view illustrating a semiconductor package according to an example embodiment of the inventive concept.
Figure 6:
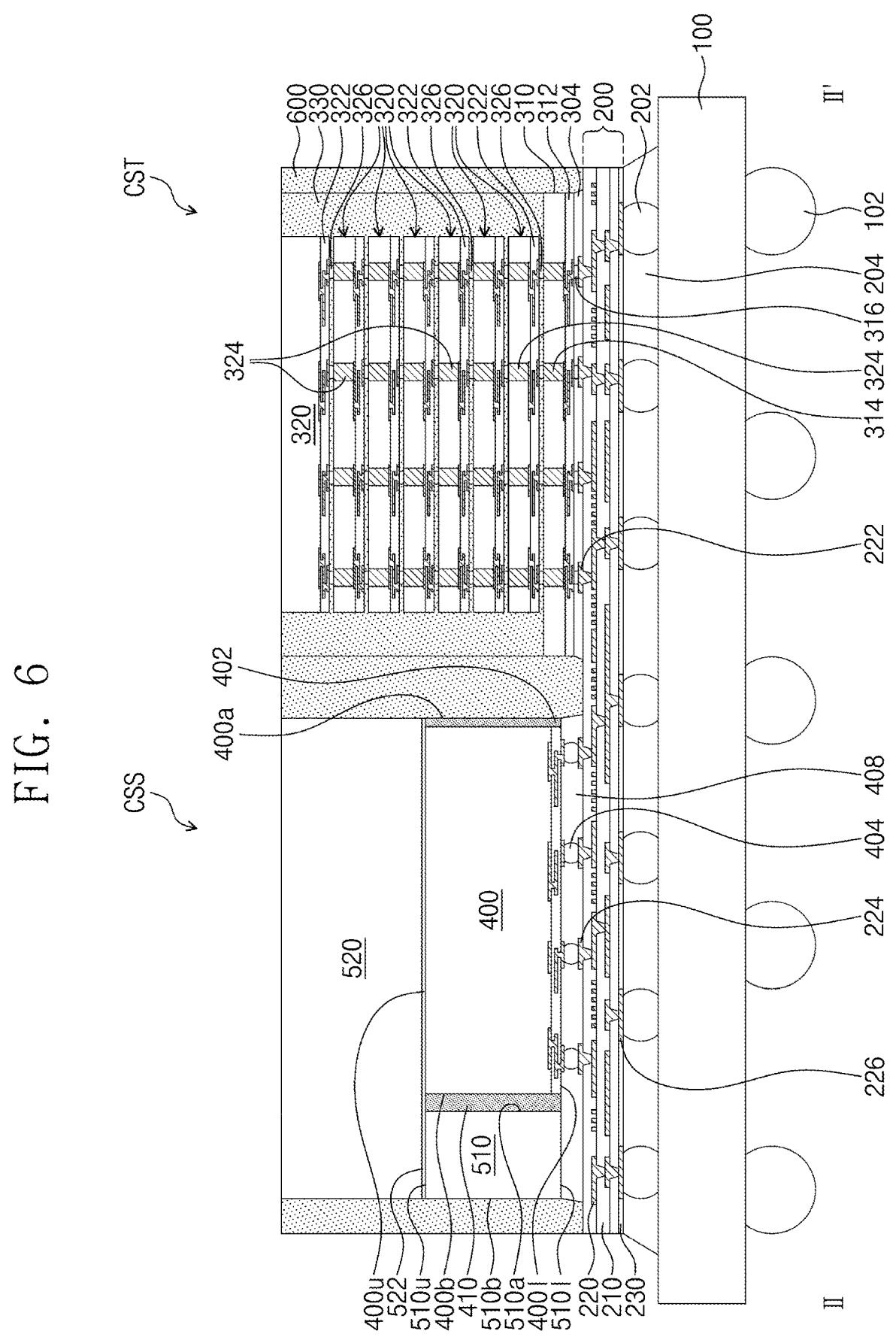
FIG. 6 is a sectional view illustrating a semiconductor package according to an example embodiment of the inventive concept.

FIG. 5 is a plan view illustrating a semiconductor package according to an example embodiment of the inventive concept. FIG. 6 is a sectional view, which is taken along a line II-II' of FIG. 5 to illustrate a semiconductor package according to an example embodiment of the inventive concept. For concise description, an element previously described with reference to FIGS. 1 to 4 may be identified by the same reference number without repeating an overlapping description thereof. That is, technical features, which are different from those in the embodiments of FIGS. 1 to 4, will be mainly described below.

Referring to FIGS. 5 and 6, the chip structure CSS may be disposed on the interposer substrate 200. The chip structure CSS may include the second semiconductor chip 400, the first dummy structure 510, and the second mold layer 410.

The second semiconductor chip 400 may have the first side surface 400*a*, which faces the chip stack CST, and the second side surface 400*b*, which does not face the chip stack CST. In an embodiment, the second side surface 400*b* may be opposite to the first side surface 400*a*. The first side surface 400*a* of the second semiconductor chip 400 may correspond to a side surface of the chip structure CSS facing the chip stack CST. The second semiconductor chip 400 may have third side surfaces 400*c*, which are located between the first side surface 400*a* and the second side surface 400*b*.

The first dummy structure 510 may be provided on the second side surface 400*b* of the second semiconductor chip 400. The first dummy structure 510 may be spaced apart from the second side surface 400*b* of the second semiconductor chip 400. When measured in a horizontal direction parallel to the second side surface 400*b* of the second semiconductor chip 400, a width of the first dummy structure 510 may be equal to or smaller than a width of the second semiconductor chip 400. The first dummy structure 510 may have the first side surface 510*a*, which faces the second semiconductor chip 400, and the second side surface 510*b*, which does not face the second semiconductor chip 400. The second side surface 510*b* of the first dummy structure 510 may be a side surface that is opposite to the first side surface 510*a*. The first dummy structure 510 may have third side surfaces 510*c* located between the first and second side surfaces 510*a* and 510*b*.

The second mold layer 410 may be interposed between the second semiconductor chip 400 and the first dummy structure 510. The second mold layer 410 may fill a space between the second semiconductor chip 400 and the first dummy structure 510. The second mold layer 410 may contact the second semiconductor chip 400 and the first dummy structure 510. The second mold layer 410 may be provided to enclose the second semiconductor chip 400, when viewed in a plan view. For example, the second mold layer 410 may extend from a region between the second semiconductor chip 400 and the first dummy structure 510*a* to regions on the second side surface 400*b* and the third side surfaces 400*c* of the second semiconductor chip 400. The second mold layer 410 may cover the first side surface 400*a*, the second side surface 400*b*, and the third side surfaces 400*c* of the second semiconductor chip 400. The second semiconductor chip 400 may be protected by the second mold layer 410. The second mold layer 410 may enclose at least a portion of the first dummy structure 510. For example, the second mold layer 410 may extend from a region between the second semiconductor chip 400 and the first dummy structure 510 to regions on the third side surfaces 510*c* of the first dummy structure 510. The second mold layer 410 may cover the first side surface 510*a* and the third side surfaces 510*c* of the first dummy structure 510. The second side surface 510*b* of the first dummy structure 510 may not be covered with the second mold layer 410 and may be exposed to the outside. Accordingly, heat, which is generated in the second semiconductor chip 400, may be easily exhausted to the outside through the second side surface 510*b* of the first dummy structure 510.

In another embodiment, the first dummy structure 510 may be disposed on one of the third side surfaces 400*c* of the second semiconductor chip 400. In this case, the second mold layer 410 may cover the remaining side surfaces of the first dummy structure 510, except for the side surface facing away from the second semiconductor chip 400.

According to an example embodiment of the inventive concept, the second mold layer 410 may be provided to enclose the side surfaces 400*a*, 400*b*, and 400*c* of the second semiconductor chip 400 and at least a portion (e.g., 510*a* and 510*c*) of the side surfaces 510*a*, 510*b*, and 510*c* of the first dummy structure 510. Accordingly, the second semiconductor chip 400 and the first dummy structure 510 may be robustly combined with each other by the second mold layer 410, and the second semiconductor chip 400 and the first dummy structure 510 may be protected from an external impact. Therefore, it may be possible to realize a semiconductor package with an improved heat-dissipation property and an improved structural stability.

Figure 7:
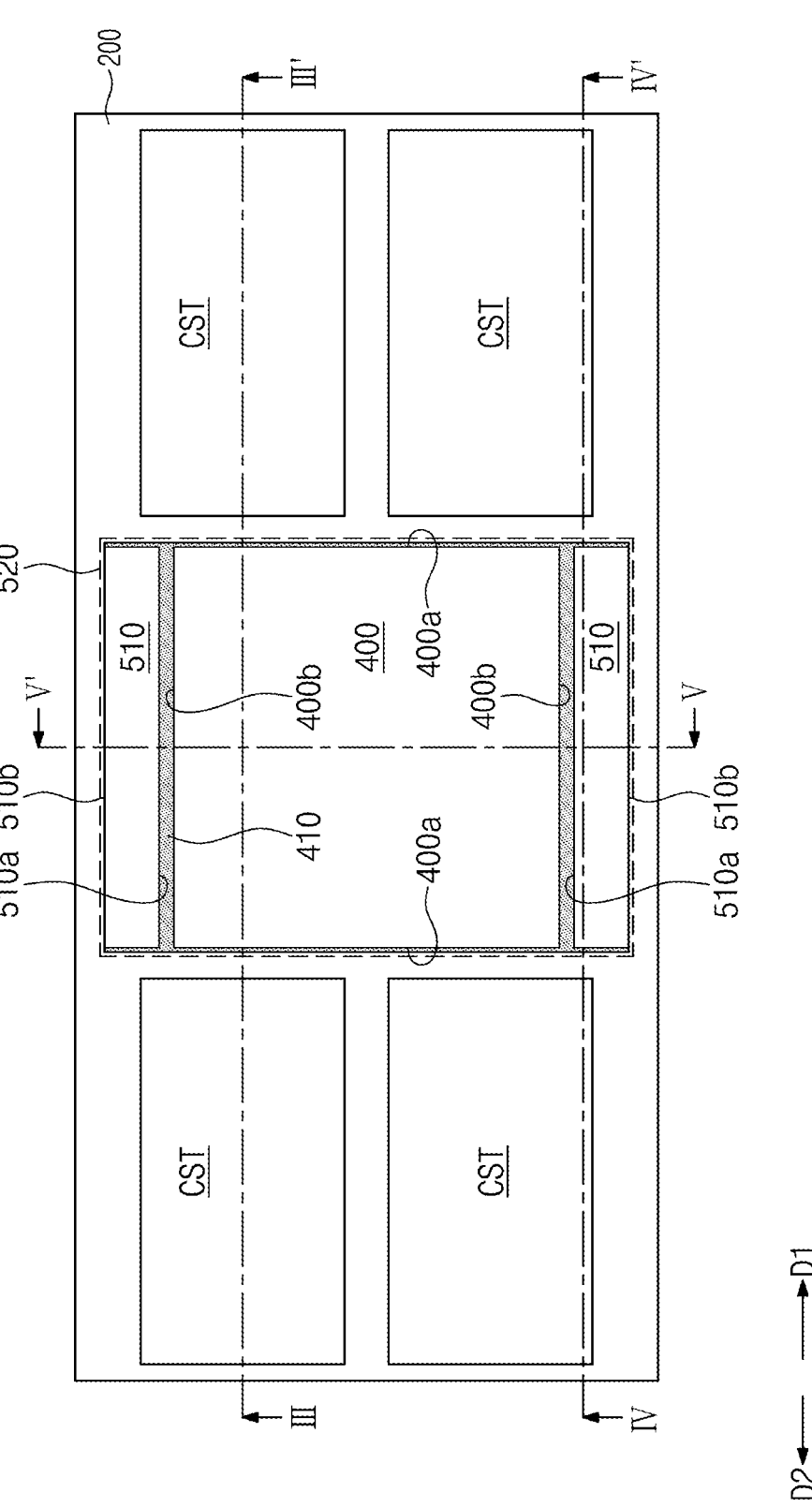
FIG. 7 is a plan view illustrating a semiconductor package according to an example embodiment of the inventive concept.
Figure 8:
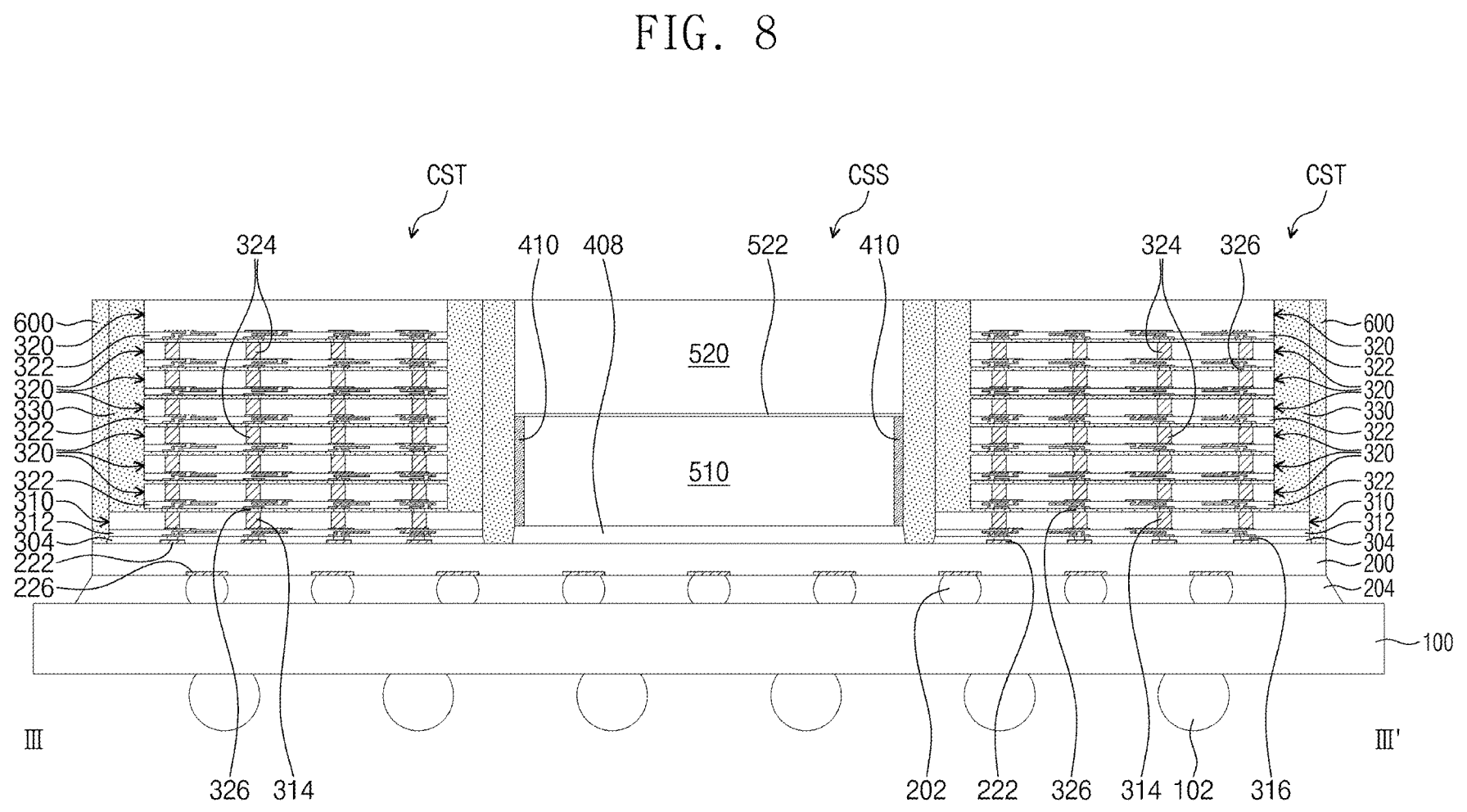
Figure 9:
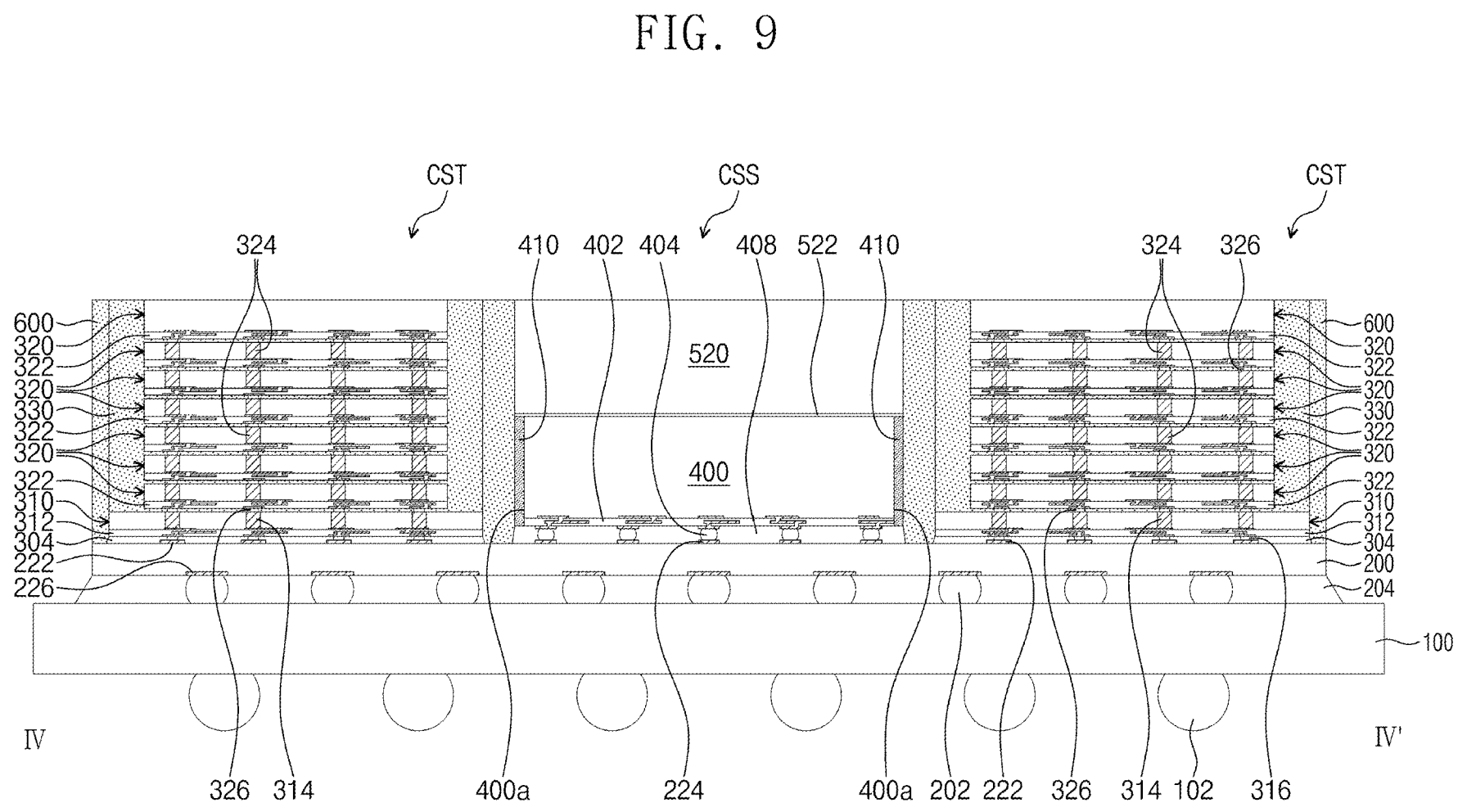
Figure 10:
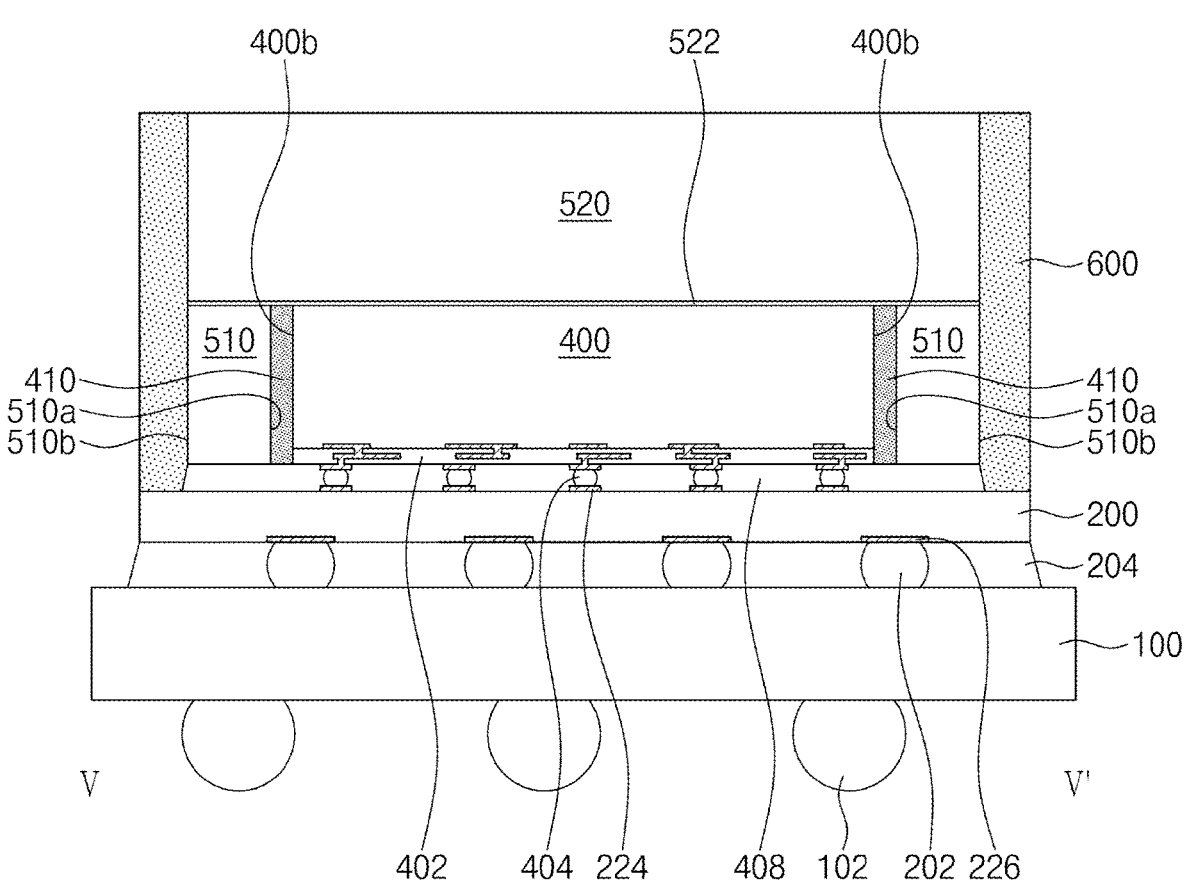

FIG. 7 is a plan view illustrating a semiconductor package according to an example embodiment of the inventive concept. FIGS. 8 to 10 are sectional views, which are respectively taken along lines III-III', IV-IV', and V-V' of FIG. 7 to illustrate a semiconductor package according to an example embodiment of the inventive concept.

Referring to FIGS. 7 to 10, a plurality of chip stacks CST may be provided. The chip stacks CST may be disposed on the interposer substrate 200 to be spaced apart from each other. When viewed in a plan view, the chip structure CSS may be disposed between the chip stacks CST. For example, the chip stacks CST may be arranged along a side surface of the chip structure CSS, which is normal to a first direction D1, and along an opposite side surface of the chip structure CSS, which is normal to a second direction D2 that is antiparallel to the first direction D1.

FIG. 7 illustrate an example, in which two chip stacks CST are arranged along the opposite side surfaces of the chip structure CSS normal to the first and second directions D1 and D2, but the inventive concept is not limited to this example. For example, one or more chip stacks CST may be arranged along the opposite side surfaces of the chip structure CSS. Furthermore, in the embodiment of FIG. 7, the chip stacks CST are illustrated to be placed on the two opposite side surfaces of the chip structure CSS, but the inventive concept is not limited to this example. The chip stacks CST may be provided on three side surfaces of the chip structure CSS, except for the remaining one side surface of the chip structure CSS.

The chip structure CSS may be disposed on the interposer substrate 200. The chip structure CSS may be spaced apart from the chip stacks CST. The chip structure CSS may include the second semiconductor chip 400, the first dummy structures 510, and the second mold layer 410.

The second semiconductor chip 400 may have the first side surfaces 400a and the second side surfaces 400b. The first side surfaces 400a may be side surfaces of the second semiconductor chip 400 that are substantially normal to the first and second directions D1 and D2. The first side surfaces 400a may be side surfaces of the second semiconductor chip 400 facing the chip stacks CST, and the second side surfaces 400b may be side surfaces of the second semiconductor chip 400, which do not face the chip stacks CST. The first side surfaces 400a of the second semiconductor chip 400 may correspond to side surfaces of the chip structure CSS facing the chip stack CST.

The first dummy structures 510 may be provided on the second side surfaces 400b of the second semiconductor chip 400. Each of the first dummy structures 510 may be disposed on a corresponding one of the second side surfaces 400b of the second semiconductor chip 400. The first dummy structures 510 may be spaced apart from the second side surfaces 400b of the second semiconductor chip 400. Here, a distance between the second side surfaces 400b of the second semiconductor chip 400 and the first dummy structures 510 may be smaller than the distance between the first side surfaces 400a of the second semiconductor chip 400 and the chip stacks CST. Each of the first dummy structures 510 may have the first side surface 510a, which faces the second semiconductor chip 400, and the second side surface 510b, which does not face the second semiconductor chip 400. The second side surface 510b may be a side surface of the first dummy structure 510 that is opposite to the first side surface 510a.

The second mold layers 410 may be disposed between the second semiconductor chip 400 and the first dummy structures 510. Each of the second mold layers 410 may be interposed between a corresponding one of the first dummy structures 510 and the second semiconductor chip 400. The second mold layers 410 may fill spaces between the second semiconductor chip 400 and the first dummy structures 510. The second mold layers 410 may connect the second semiconductor chip 400 to the first dummy structures 510. In other words, the second semiconductor chip 400 and the first dummy structures 510 may be combined by the second mold layers 410. In one embodiment, the first dummy structures 510 may be provided to contact the second semiconductor chip 400, and in this case, the second mold layers 410 may not be provided. In this case, the first dummy structures 510 may contact the second side surfaces 400b of the second semiconductor chip 400. Though not shown, in one embodiment, the second side surface 510b of the first dummy structures 510 may be exposed to the outside.

According to an example embodiment of the inventive concept, since the first dummy structures 510 are disposed on the side surfaces 400b of the second semiconductor chip 400, which does not face the chip stacks CST, and not on the side surfaces 400a of the second semiconductor chip 400 facing the chip stacks CST, the heat, which is generated in the second semiconductor chip 400, may be directly exhausted to the outside through the first dummy structures 510. Thus, it may be possible to improve the heat-dissipation efficiency of the semiconductor package.

The second connection terminals 404 may be provided on the lower surface of the second semiconductor chip 400 of the chip structure CSS. The chip structure CSS may be mounted on the interposer substrate 200. For example, the chip structure CSS may be coupled to the second substrate pads 224 of the interposer substrate 200 through the second connection terminals 404. The third under-fill layer 408 may be provided between the interposer substrate 200 and the chip structure CSS.

The second dummy structure 520 may be provided on the chip structure CSS. The second dummy structure 520 may be attached to the upper surface of the chip structure CSS. For example, the second dummy structure 520 may be attached to the entire upper surface of the second semiconductor chip 400. In one embodiment, the entirety of the second semiconductor chip 400 may overlap with at least a portion of the second dummy structure 520. The second dummy structure 520 may be attached to the upper surfaces of the first dummy structures 510 and the upper surface of the second mold layer 410. The upper surface of the second dummy structure 520 may be located at the same level as the upper surface of the chip stack CST.

FIGS. 11A to 15A are plan views illustrating a method of fabricating a semiconductor package according to an example embodiment of the inventive concept. FIGS. 11B to 15B are sectional views, which are respectively taken along lines VI-VI' of FIGS. 11A to 15A to illustrate a method of fabricating a semiconductor package according to an example embodiment of the inventive concept. FIG. 16 is a sectional view illustrating a method of fabricating a semiconductor package, according to an example embodiment of the inventive concept.

Figure 11A:
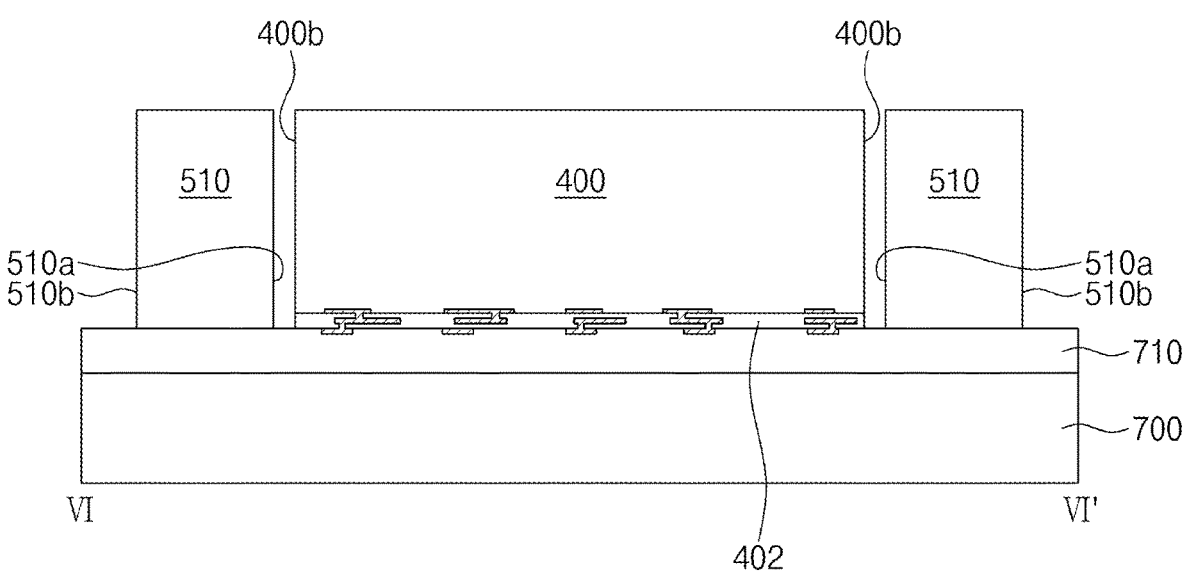
Figure 11B:
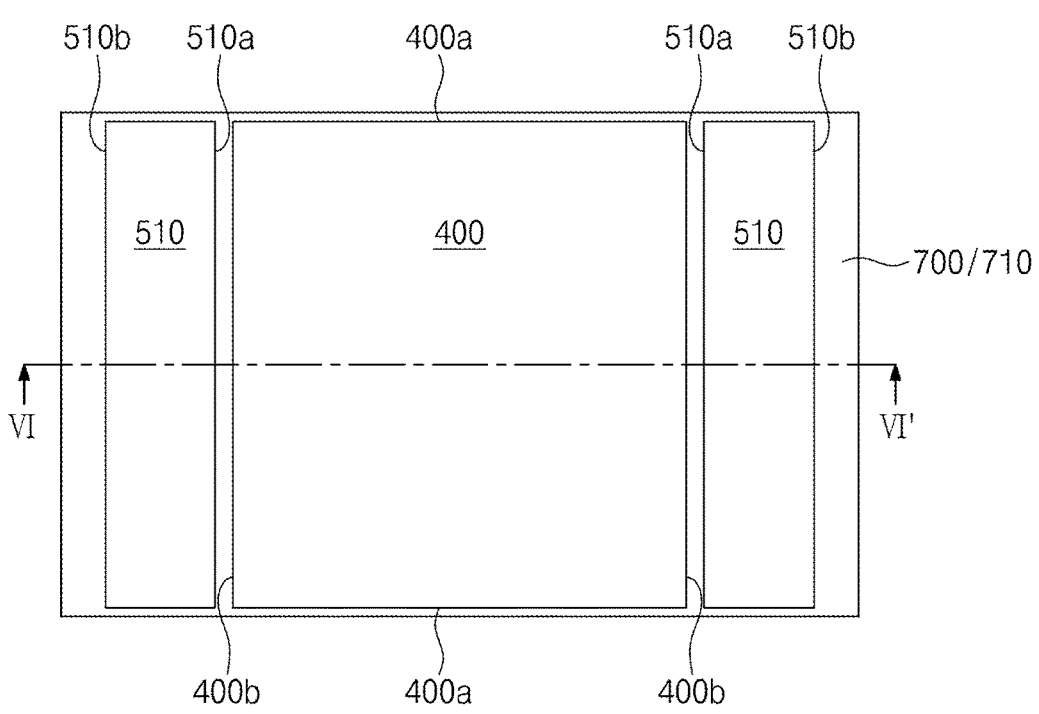

Referring to FIGS. 11A and 111B, the second semiconductor chip 400 may be provided. The second semiconductor chip 400 may be formed of or include a semiconductor material (e.g., silicon (Si)). The second semiconductor chip 400 may include the second circuit layer 402. The second circuit layer 402 may include a logic circuit. For example, the second semiconductor chip 400 may be a logic chip. The lower surface of the second semiconductor chip 400 may be an active surface, and the upper surface of the second semiconductor chip 400 may be an inactive surface. The second semiconductor chip 400 may have a thickness of 200 μm or thicker. The second semiconductor chip 400 may have the first side surfaces 400a, which are opposite to each other, and the second side surfaces 400b, which are provided between the first side surfaces 400a.

The first dummy structures 510 may be provided. The first dummy structures 510 may have a thickness of 200 μm or thicker. A width in a first horizontal direction of the first dummy structures 510 may be equal to or smaller than a width in the first horizontal direction of the second semiconductor chip 400. The first dummy structures 510 may have the first and second side surfaces 510a and 510b, which are opposite to each other. An integrated circuit may not be provided in the first dummy structures 510. The first dummy structures 510 may be formed of or include at least one of materials having high thermal conductivity. For example, the first dummy structures 510 may be formed of or include bulk silicon (Si).

A carrier substrate 700 may be provided. The carrier substrate 700 may be an insulating substrate including or formed of glass or polymer or a conductive substrate including or formed of a metallic material.

An adhesive member 710 may be provided on an upper surface of the carrier substrate 700. In an embodiment, the adhesive member 710 may include an adhesive tape.

The second semiconductor chip 400 and the first dummy structures 510 may be attached to the carrier substrate 700. The second semiconductor chip 400 and the first dummy structures 510 may be attached to the carrier substrate 700 using the adhesive member 710. Here, in the case where chip pads of the second semiconductor chip 400 have a structure extended into a region below the lower surface of the second semiconductor chip 400, the chip pads of the second semiconductor chip 400 may be inserted in the adhesive member 710. Each of the first dummy structures 510 may be disposed to be adjacent to a corresponding one of the second side surfaces 400*b* of the second semiconductor chip 400. The first side surface 510*a* of the first dummy structures 510 may face one of the second side surfaces 400*b* of the second semiconductor chip 400.

Figure 12A:
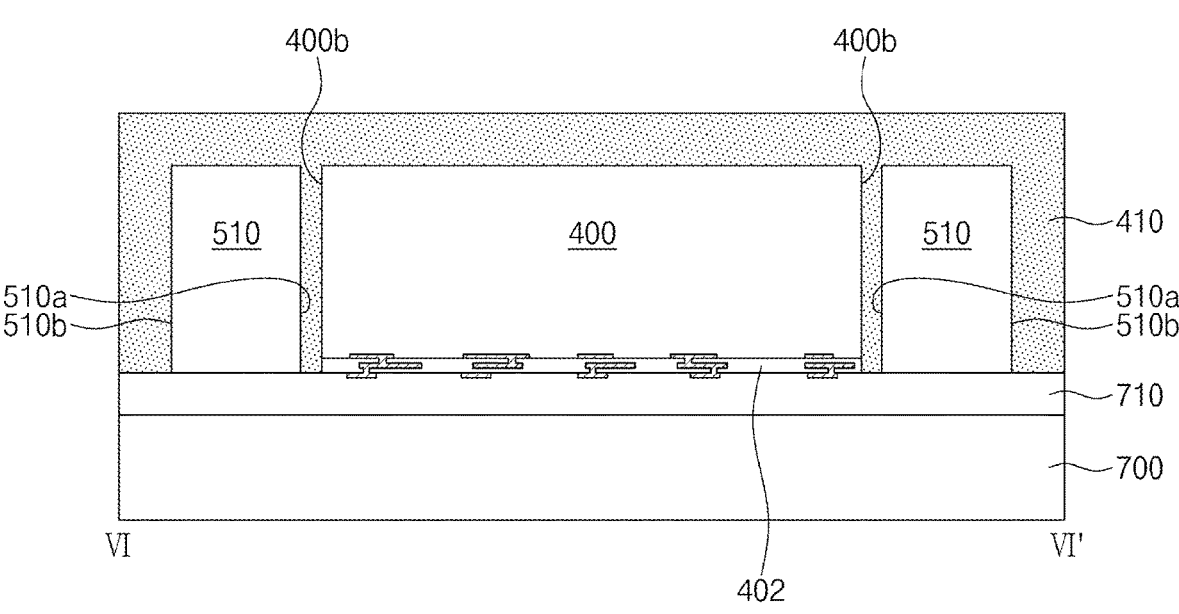
Figure 12B:
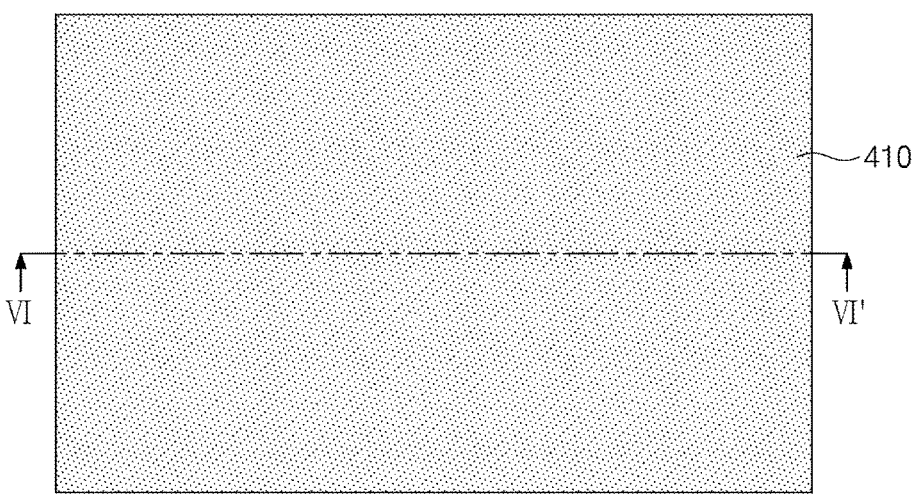

Referring to FIGS. 12A and 12B, the second mold layer 410 may be formed. For example, the second mold layer 410 may be formed by coating the carrier substrate 700 with an insulating material. The second mold layer 410 may cover the second semiconductor chip 400 and the first dummy structures 510. The second mold layer 410 may fill spaces between the second semiconductor chip 400 and the first dummy structures 510. The second semiconductor chip 400 and the first dummy structures 510 may be buried in the second mold layer 410 and may not be exposed to the outside. The lower surface (e.g., bottom surface) of the second mold layer 410, the lower surface (e.g., bottom surface) of the first dummy structure 510, and the lower surface (e.g., bottom surface) of the second semiconductor chip 400 may be coplanar with each other. The insulating material may be formed of or include an insulating material (e.g., epoxy molding compound (EMC)) or an adhesive material.

Figure 13A:
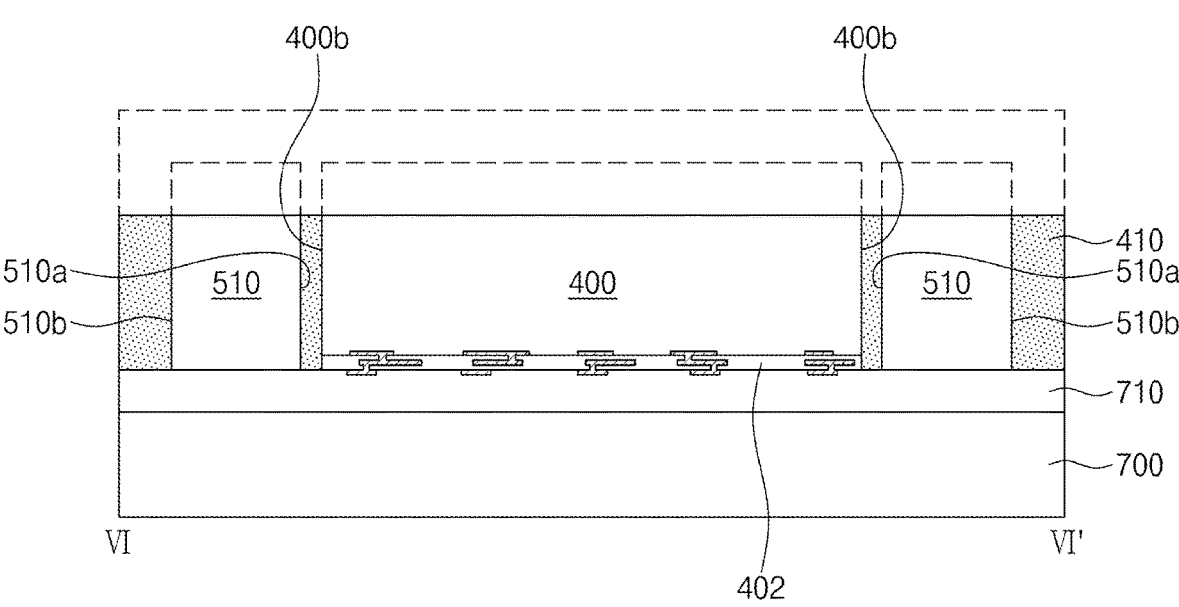
Figure 13B:
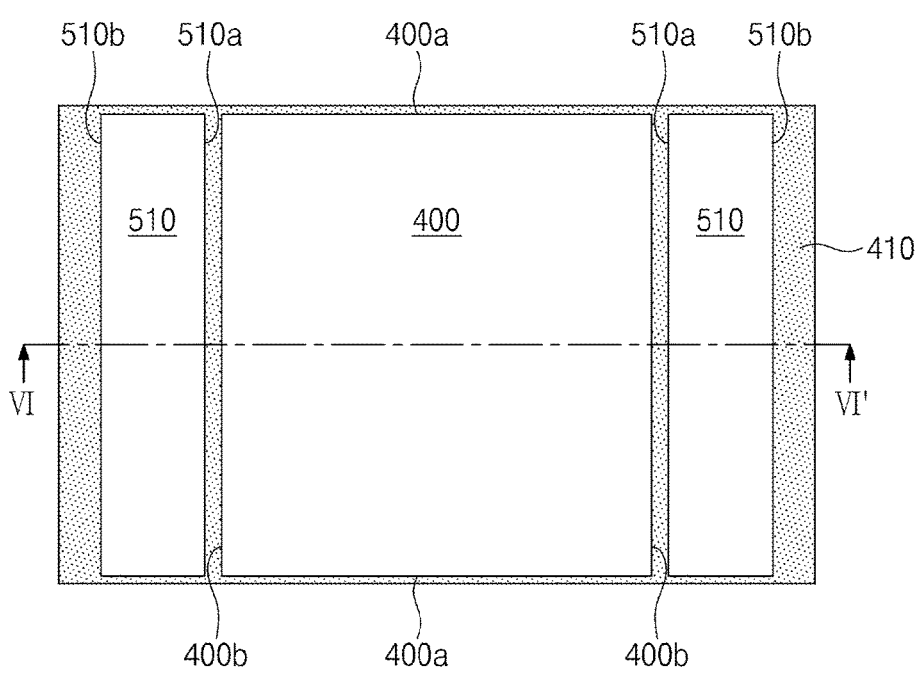

Referring to FIGS. 13A and 13B, a planarization process may be performed on the second mold layer 410 to expose the upper surface of the second semiconductor chip 400. The planarization process may include an etch-back process or a chemical-mechanical polishing (CMP) process. As a result of the planarization process, the upper surface of the second semiconductor chip 400 and the upper surface of the first dummy structures 510 may be exposed to the outside. In an embodiment, the planarization process may be further performed after the upper surface of the second semiconductor chip 400 and the upper surface of the first dummy structures 510 are exposed to the outside. The planarization process may be performed until the second semiconductor chip 400 has a specific thickness. That is, the planarization process may correspond to a thinning process. For example, the planarization process may be performed such that the second semiconductor chip 400 has a thickness in a range from 50 µm to 200 µm. As a result of the planarization process, the second mold layer 410, the first dummy structures 510, and the second semiconductor chip 400 may have upper surfaces (e.g., top surfaces) that are coplanar with each other.

Figure 14A:
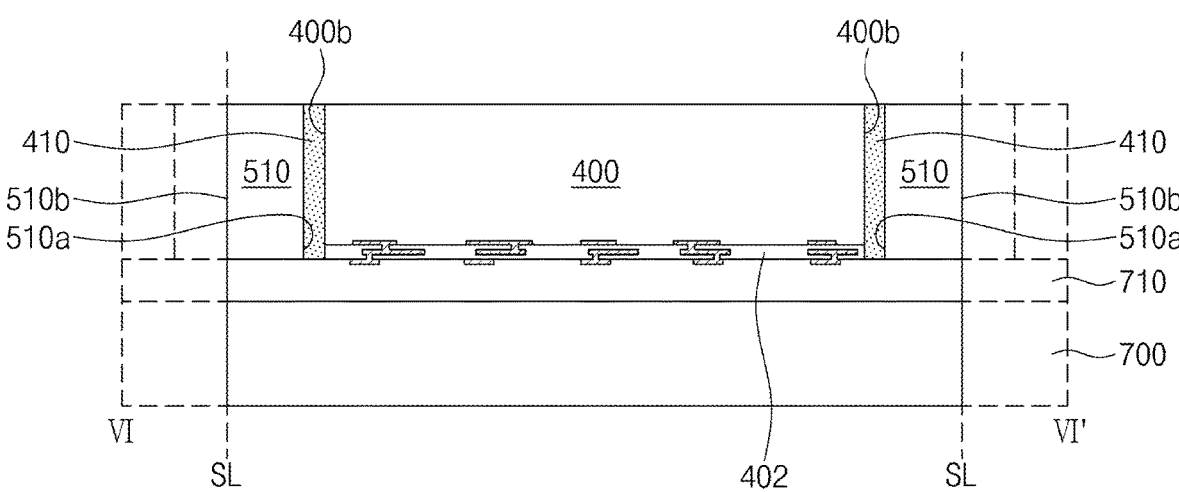
Figure 14B:
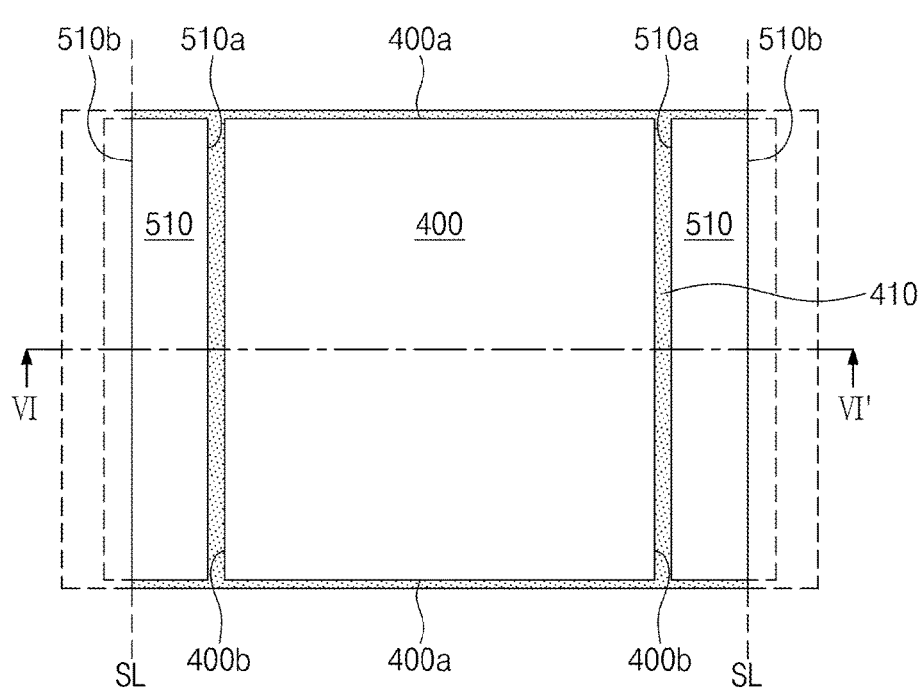

Referring to FIGS. 14A and 14B, a sawing process may be performed along sawing lines SL. The sawing lines SL may be defined between the first and second side surfaces 510*a* and 510*b* of the first dummy structures 510 and parallel to the first and second side surfaces 510*a* and 510*b*. The first dummy structures 510, the adhesive member 710, and the carrier substrate 700 may be sequentially cut by the sawing process. Accordingly, the second side surface 510*b* of the first dummy structures 510 may be exposed to the outside.

The chip structure CSS may be fabricated through the above processes.

Figure 15A:
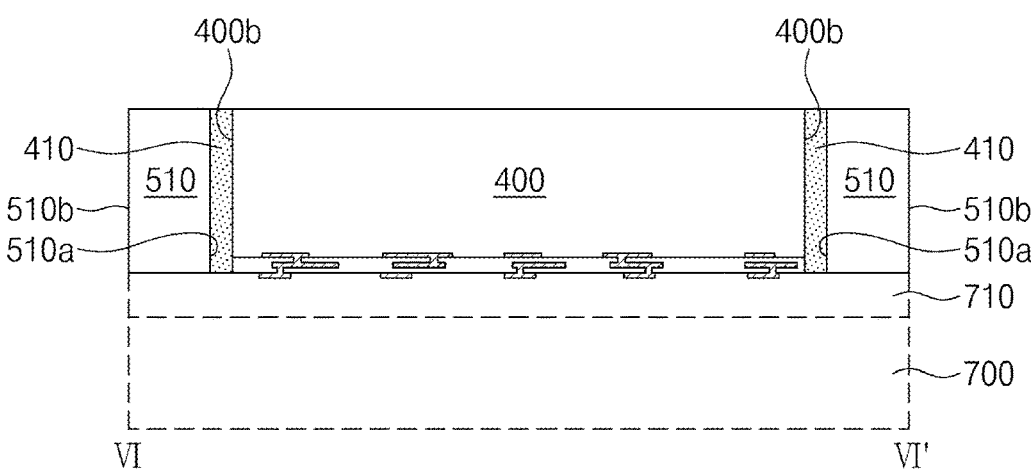
Figure 15B:
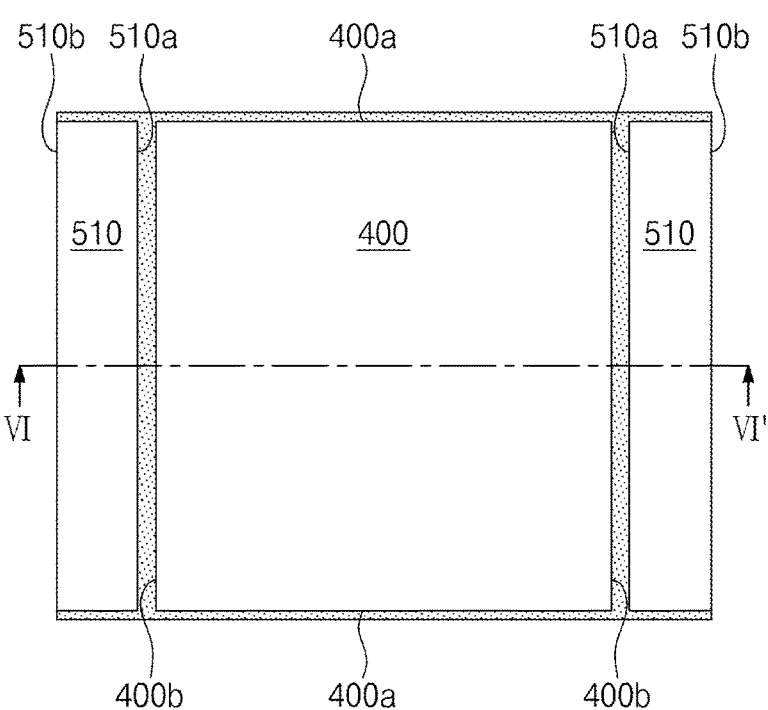
Figure 16:
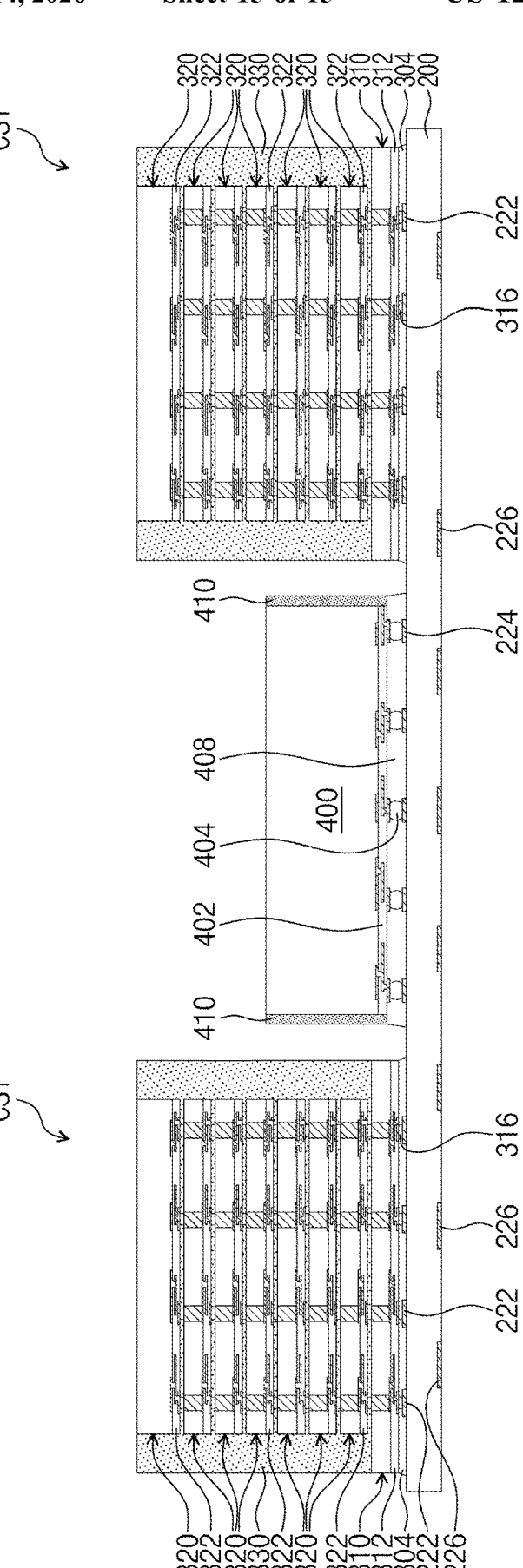
FIG. 16 is a sectional view illustrating a method of fabricating a semiconductor package, according to an example embodiment of the inventive concept.

Referring to FIGS. 15A and 15B, the chip structure CSS may be separated from the carrier substrate 700. For example, the carrier substrate 700 may be detached from the chip structure CSS by removing the adhesive member 710. For example, the adhesive member 710 may be fully removed by a chemical method. Alternatively, the chip structure CSS may be detached from the carrier substrate 700 and the adhesive member 710 by a physical method. Accordingly, the lower surface of the chip structure CSS may be exposed to the outside. For example, the lower surface of the second semiconductor chip 400, the lower surfaces of the first dummy structures 510, and the lower surface of the second mold layer 410 may be exposed to the outside. Here, the exposed lower surface of the second semiconductor chip 400 may be an active surface of the second semiconductor chip 400. The lower surface of the second semiconductor chip 400, the lower surface of the first dummy structure 510, and the lower surface of the second mold layer 410 may be coplanar with each other.

Referring to FIGS. 7 and 16, the interposer substrate 200 may be provided. The interposer substrate 200 may include at least two substrate wiring layers. Each of the substrate wiring layers may include the substrate insulating pattern 210 and the substrate wire pattern 220, which is provided in the substrate insulating pattern 210. The head portion of the substrate wire pattern 220 of the uppermost one of the substrate wiring layers may correspond to the substrate pads 222 and 224 of the interposer substrate 200. The substrate pads 222 and 224 may include the first substrate pads 222, which are used to mount the chip stack CST, and the second substrate pads 224, which are used to mount the chip structure CSS. The third substrate pads 226 may be provided below the lowermost one of the substrate wiring layers.

The chip stacks CST and the chip structure CSS may be provided on the interposer substrate 200. The chip stacks CST may be provided to have substantially the same or similar features as that in FIG. 1. For example, the chip stacks CST may include a base substrate 310, the first semiconductor chips 320 stacked on the base substrate 310, and the first mold layer 330 enclosing the first semiconductor chips 320.

The chip stacks CST may be mounted on the interposer substrate 200. The chip stacks CST may be mounted on the interposer substrate 200 in a flip-chip bonding manner. The first connection terminals 316 may be provided on the lower surfaces of the chip stacks CST. The first connection terminals 316 may include solder balls or solder bumps. The second under-fill layer 304 may be provided on the lower surfaces of the chip stacks CST to enclose the first connection terminals 316. For example, the second under-fill layer 304 may be a non-conductive adhesive agent or a non-conductive film. In the case where the second under-fill layer 304 is the non-conductive adhesive agent, a liquid non-conductive adhesive agent may be formed on the chip stacks CST by a dispensing method. In the case where the second under-fill layer 304 is the non-conductive film, the non-conductive film may be attached to the chip stacks CST. Thereafter, the chip stacks CST may be aligned to place the first connection terminals 316 on the first substrate pads 222 of the interposer substrate 200, and then, a reflow process may be performed on the chip stacks CST.

The chip structure CSS may be mounted on the interposer substrate 200. For example, the chip structure CSS may be mounted on the interposer substrate 200 in a flip-chip bonding manner. The second connection terminals 404 may be provided on the lower surface of the second semiconductor chip 400 of the chip structure CSS. The second connection terminals 404 may include solder balls or solder bumps. The third under-fill layer 408 may be provided on the lower surface of the chip structure CSS to enclose the second connection terminals 404. In an embodiment, the third under-fill layer 408 may be a non-conductive adhesive agent or a non-conductive film. In the case where the third under-fill layer 408 is the non-conductive adhesive agent, a liquid non-conductive adhesive agent may be formed on the chip structure CSS by a dispensing method. In the case where the third under-fill layer 408 is the non-conductive film, the non-conductive film may be attached to the chip structure CSS. Next, the chip structure CSS may be aligned to place the second connection terminals 404 on the second substrate pads 224 of the interposer substrate 200, and then, a reflow process may be performed on the chip structure CSS. The chip structure CSS may be spaced apart from the interposer substrate 200 by the second connection terminals 404, and the first dummy structure 510 may be spaced apart from the interposer substrate 200. In one embodiment, the steps of mounting the chip structure CSS and mounting the chip stacks CST may be performed at the same time. The chip stacks CST may be disposed near the first side surfaces 400a of the second semiconductor chip 400 of the chip structure CSS.

According to an example embodiment of the inventive concept, since the thinning process is performed on the chip structure CSS, a thickness of the second semiconductor chip 400 may be reduced. It may be possible to suppress a warpage issue of the second semiconductor chip 400 containing silicon (Si), in the reflow process, which is performed as a part of the mounting process of the chip structure CSS. Accordingly, it may be possible to prevent a decoupling issue between the second connection terminals 404 and the interposer substrate 200, which may occur when the second semiconductor chip 400 is largely separated from the interposer substrate 200. Furthermore, it may be possible to prevent a short issue between the second connection terminals 404 or between the second semiconductor chip 400 and the second substrate pads 224 of the interposer substrate 200, which may occur when the second semiconductor chip 400 is placed to be excessively close to the interposer substrate 200. Therefore, it may be possible to reduce a failure in a process of fabricating a semiconductor package and to realize a semiconductor package with improved structural stability.

Referring further to FIGS. 7 to 10, the second dummy structure 520 may be attached to the chip structure CSS. The second dummy structure 520 may be attached to the upper surface of the chip structure CSS. For example, the second dummy structure 520 may be attached to the upper surface of the chip structure CSS using the adhesive layer 522. The first dummy structure 510 may be formed of or include at least one of materials having high thermal conductivity. For example, the first dummy structure 510 may be formed of or include bulk silicon (Si). The adhesive layer 522 may be formed of or include a thermal interface material (TIM) (e.g., thermal grease).

The third mold layer 600 may be formed. For example, the third mold layer 600 may be formed by coating the interposer substrate 200 with an insulating material. The third mold layer 600 may cover the chip stacks CST, the chip structure CSS, and the second dummy structure 520. Thereafter, a grinding process may be performed on the third mold layer 600. As a result, an upper portion of the third mold layer 600 may be partially removed. The third mold layer 600 may have an upper surface that is coplanar with the upper surfaces of the chip stacks CST and the upper surface of the second dummy structure 520.

In a semiconductor package according to an example embodiment of the inventive concept, since a first dummy structure having high thermal conductivity is provided on at least one of surfaces of a semiconductor chip, heat, which is generated in the semiconductor chip, may be easily exhausted to the outside through a side surface of the first dummy structure, which side surface may be exposed with respect to a mold layer of the semiconductor package. Especially, since the first dummy structure is disposed on a side surface of the semiconductor chip, which does not face a chip stack, not on a side surface of the semiconductor chip facing the chip stack, the heat, which is generated in the semiconductor chip, may be directly exhausted to the outside through the first dummy structure. Thus, it may be possible to improve the heat-dissipation efficiency of the semiconductor package.

Furthermore, since a second dummy structure having high thermal conductivity is provided on an upper surface of the semiconductor chip, the heat, which is generated in the semiconductor chip, may be easily exhausted to an external space on the second dummy structure. Especially, since the first and second dummy structures having high thermal conductivity are provided on the surface and upper surfaces of the semiconductor chip, the heat, which is generated in the semiconductor chip, may be easily exhausted to the outside. Thus, it may be possible to further improve the heat-dissipation efficiency of the semiconductor package.

In a method of fabricating a semiconductor package according to an example embodiment of the inventive concept, a thinning process may be performed on a chip structure to reduce a thickness of the semiconductor chip. It may be possible to suppress a warpage issue of the semiconductor chip containing silicon, in a reflow process, which is performed as a part of a process of mounting the chip structure. As a result, it may be possible to reduce a failure in a process of fabricating a semiconductor package and to realize a semiconductor package with improved structural stability.

While example embodiments of the inventive concept have been particularly shown and described, it will be understood by one of ordinary skill in the art that variations in form and detail may be made therein without departing from the spirit and scope of the attached claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A semiconductor package, comprising:

a substrate;

a chip structure mounted on the substrate;

a chip stack mounted on the substrate and spaced apart from the chip structure; and a first dummy block disposed on a top surface of the chip structure, wherein the chip structure comprises:

a first semiconductor chip;

a second dummy block disposed at a side of the first semiconductor chip; and a mold layer covering the first semiconductor chip and the second dummy block, wherein a bottom surface of the first semiconductor chip, a bottom surface of the second dummy block, and a bottom surface of the mold layer are coplanar with each other, wherein the chip stack comprises second semiconductor chips, which are vertically stacked on the substrate, wherein the second dummy block is disposed on a side surface of the first semiconductor chip, which does not face the chip stack, and wherein the chip stack is disposed to horizontally overlap the first semiconductor chip and is disposed to horizontally overlap the first dummy block.

2. The semiconductor package of claim 1, wherein the chip structure is electrically connected to the substrate through connection terminals, which are provided between the first semiconductor chip and the substrate.

3. The semiconductor package of claim 2, further comprising an under-fill layer, which fills a space between the chip structure and the substrate and encloses the connection terminals, wherein the second dummy block is spaced apart from the substrate by the under-fill layer.

4. The semiconductor package of claim 3, wherein a width in a first horizontal direction of the under-fill layer is larger than a width in the first horizontal direction of the chip structure.

5. The semiconductor package of claim 1, wherein a top surface of the first semiconductor chip, a top surface of the second dummy block, and a top surface of the mold layer are coplanar with each other.

6. The semiconductor package of claim 1, wherein the second dummy block comprises a first side surface facing the first semiconductor chip and a second side surface opposite to the first side surface, and the second side surface of the second dummy block is exposed to an outside of the mold layer.

7. The semiconductor package of claim 1, wherein a first distance in a first horizontal direction between the first semiconductor chip and the chip stack is larger than a second distance in the first horizontal direction between the first semiconductor chip and the second dummy block.

8. The semiconductor package of claim 1, wherein an upper surface of the chip stack is disposed at the same level as an upper surface of the first dummy block.

9. The semiconductor package of claim 1, wherein the entirety of the first semiconductor chip overlaps at least a portion of the first dummy block, when viewed in a plan view.

10. A semiconductor package, comprising:

a package substrate;

an interposer substrate disposed on the package substrate;

a chip stack mounted on the interposer substrate, the chip stack comprising first semiconductor chips, which are vertically stacked;

a second semiconductor chip mounted on the interposer substrate and horizontally spaced apart from the chip stack, the second semiconductor chip having a first side surface facing the chip stack, a second side surface adjacent to the first side surface, and a third side surface opposite the first side surface;

a first dummy structure provided on one of the second side surface of the second semiconductor chip and the third side surface of the second semiconductor chip;

a mold layer covering the second semiconductor chip and the first dummy structure; and an under-fill layer filling a space between the second semiconductor chip and the interposer substrate and between the first dummy structure and the interposer substrate, wherein the first dummy structure is spaced apart from the interposer substrate by the under-fill layer, wherein the first dummy structure comprises bulk silicon, wherein the mold layer is provided to fill a space between the second semiconductor chip and the first dummy structure, and wherein a bottom surface of the mold layer contacts a top surface of the under-fill layer and is coplanar with a bottom surface of the first dummy structure and a bottom surface of the second semiconductor chip.

11. The semiconductor package of claim 10, wherein the first dummy structure has a first side surface facing the second semiconductor chip and a second side surface opposite to the first side surface, and the second side surface of the first dummy structure is exposed to an outside of the mold layer.

12. The semiconductor package of claim 10, wherein a top surface of the chip stack is coplanar with a top surface of the first dummy structure.

13. The semiconductor package of claim 10, wherein the second semiconductor chip is electrically connected to the interposer substrate through connection terminals, which are provided between the second semiconductor chip and the interposer substrate, and the under-fill layer is provided to enclose the connection terminals.

14. The semiconductor package of claim 10, wherein a first distance in a first horizontal direction between the second semiconductor chip and the chip stack is larger than a second distance in the first horizontal direction between the second semiconductor chip and the first dummy structure.

15. The semiconductor package of claim 10, further comprising a second dummy structure, which is attached to a top surface of the second semiconductor chip.

16. The semiconductor package of claim 15, wherein a top surface of the chip stack is disposed at the same level as a top surface of the second dummy structure.

17. A semiconductor package, comprising:

a substrate;

a chip stack mounted on the substrate, the chip stack comprising first semiconductor chips, which are vertically stacked;

a chip structure mounted on the substrate and horizontally spaced apart from the chip stack;

a first dummy structure disposed on the chip structure; and a first mold layer disposed on the substrate to enclose the chip stack, the chip structure, and the first dummy structure, wherein the chip structure comprises:

a second semiconductor chip having a vertically-extending first side surface facing the chip stack, a vertically-extending second side surface adjacent to the first side surface, and a vertically-extending third side surface opposite the first side surface;

a second dummy structure disposed on the second side surface of the second semiconductor chip or the third side surface of the second semiconductor chip; and a second mold layer disposed between the second semiconductor chip and the second dummy structure to connect the second semiconductor chip to the second dummy structure, wherein the first dummy structure is attached to an upper surface of the second semiconductor chip and an upper surface of the second dummy structure, wherein the chip structure is mounted on the substrate through a connection terminal below the second semiconductor chip, wherein the second dummy structure is spaced apart from the substrate, and wherein the chip stack is disposed to horizontally overlap the second semiconductor chip and is disposed to horizontally overlap the first dummy structure.

\* \* \* \* \*